(12) United States Patent
Lin et al.

(10) Patent No.: US 11,823,887 B2
(45) Date of Patent: Nov. 21, 2023

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Yu-Sheng Lin, Hsinchu County (TW); Han-Hsiang Huang, Hsinchu (TW); Chien-Sheng Chen, Hsinchu (TW); Shu-Shen Yeh, Taoyuan (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 98 days.

(21) Appl. No.: 17/376,186

(22) Filed: Jul. 15, 2021

(65) Prior Publication Data
US 2022/0302011 A1    Sep. 22, 2022

Related U.S. Application Data

(60) Provisional application No. 63/163,055, filed on Mar. 19, 2021.

(51) Int. Cl.
*H01L 21/48* (2006.01)
*H01L 23/498* (2006.01)
(Continued)

(52) U.S. Cl.
CPC .... *H01L 23/49838* (2013.01); *H01L 21/4853* (2013.01); *H01L 21/563* (2013.01);
(Continued)

(58) Field of Classification Search
CPC .......... H01L 23/49838; H01L 21/4853; H01L 21/563; H01L 21/565; H01L 21/6835; H01L 23/3128; H01L 23/3135; H01L 23/49811; H01L 23/562; H01L 24/16; H01L 25/0655; H01L 25/50; H01L 2221/68331; H01L 2221/68372;
(Continued)

(56) References Cited

U.S. PATENT DOCUMENTS 8,802,504 B1    8/2014    Hou et al.
8,803,292 B2    8/2014    Chen et al.
(Continued)

OTHER PUBLICATIONS

"Office Action of Taiwan Counterpart Application", dated Mar. 2, 2023, p. 1-p. 8.

*Primary Examiner* — Elias Ullah
(74) *Attorney, Agent, or Firm* — JCIPRNET

(57) ABSTRACT

A package structure includes a circuit substrate, a semiconductor package, first bump structures and second bump structures. The semiconductor package is disposed on the circuit substrate, wherein the semiconductor package includes a center region and side regions surrounding the center region. The first bump structures are disposed on the center region of the semiconductor package and electrically connecting the semiconductor package to the circuit substrate. The second bump structures are disposed on the side regions of the semiconductor package and electrically connecting the semiconductor package to the circuit substrate, wherein the first bump structures and the second bump structures have different heights and different shapes.

20 Claims, 25 Drawing Sheets

(51) Int. Cl.
*H01L 21/56* (2006.01)
*H01L 21/683* (2006.01)
*H01L 23/31* (2006.01)
*H01L 23/00* (2006.01)
*H01L 25/065* (2023.01)
*H01L 25/00* (2006.01)

(52) U.S. Cl.
CPC ........ *H01L 21/565* (2013.01); *H01L 21/6835* (2013.01); *H01L 23/3128* (2013.01); *H01L 23/3135* (2013.01); *H01L 23/49811* (2013.01); *H01L 23/562* (2013.01); *H01L 24/16* (2013.01); *H01L 25/0655* (2013.01); *H01L 25/50* (2013.01); *H01L 2221/68331* (2013.01); *H01L 2221/68372* (2013.01); *H01L 2224/16227* (2013.01); *H01L 2924/18161* (2013.01); *H01L 2924/3511* (2013.01)

(58) Field of Classification Search
CPC . H01L 2224/16227; H01L 2924/18161; H01L 2924/3511; H01L 23/49816; H01L 23/5385; H01L 23/5386; H01L 23/5383; H01L 2221/68327; H01L 2221/68345; H01L 2221/68354; H01L 21/561; H01L 2224/16225; H01L 2224/32225; H01L 2224/73204; H01L 2224/97; H01L 2924/15311; H01L 2924/181; H01L 24/14; H01L 23/31; H01L 2224/1403
See application file for complete search history.

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2009/0039490 A1 | 2/2009 | Fan |
| 2016/0307863 A1 | 10/2016 | Lin et al. |

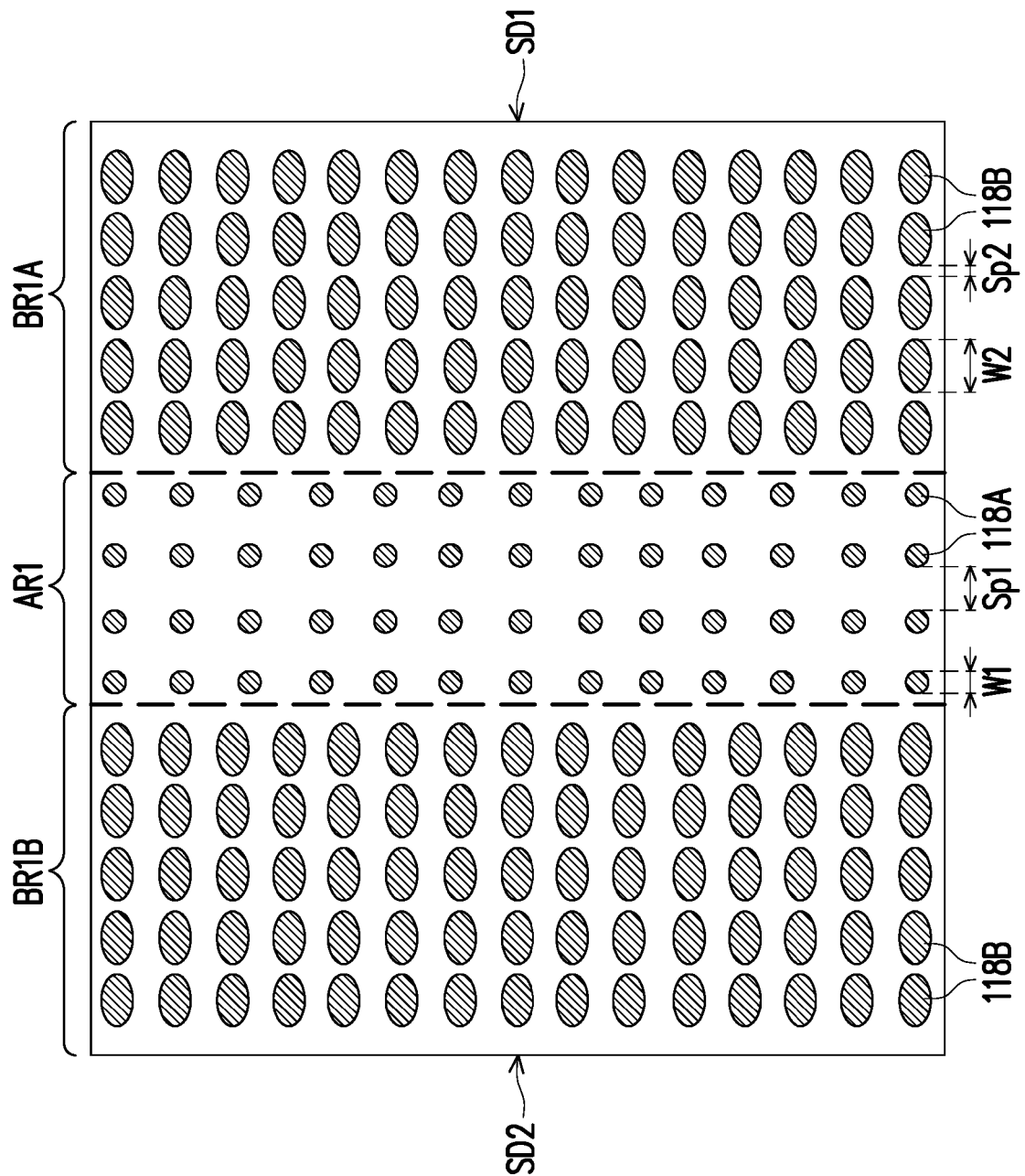

PACKAGE STRUCTURE AND METHOD OF FABRICATING THE SAME

CROSS-REFERENCE TO RELATED APPLICATION

This application claims the priority benefit of U.S. provisional application Ser. No. 63/163,055, filed on Mar. 19, 2021. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 6A and FIG. 6B are schematic sectional and top views of a semiconductor package according to some other embodiments of the present disclosure.

DETAILED DESCRIPTION

Figure 1A:
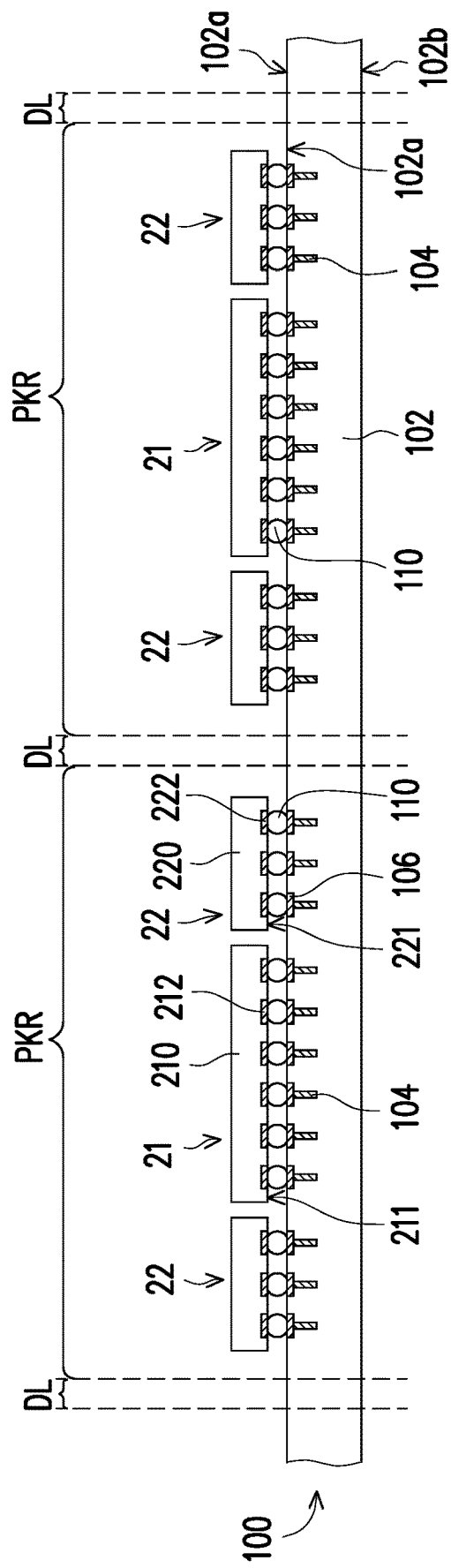
FIG. 1A to FIG. 1L are schematic top and sectional views of various stages in a method of fabricating a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In current applications, during the bonding of semiconductor packages onto the substrate, due to a high warpage of the semiconductor package, the package structure sometimes suffers from bridging or cold joint problems. The warpage issue is more common in large packages, such as chip-on-wafer (CoW) packages. In some embodiments of the present disclosure, as the warpage of the semiconductor package is generally hard to control due to complex material constitution, the design of the bump structures on the semiconductor package is adjusted to avoid or reduce the cold joint problem and to improve the reliability of the package structure.

FIG. 1A to FIG. 1L are schematic top and sectional views of various stages in a method of fabricating a semiconductor package according to some exemplary embodiments of the present disclosure. Referring to FIG. 1A, an interposer structure 100 is provided. In some embodiments, the interposer structure 100 includes a core portion 102, and a plurality of through vias 104 and conductive pads 106 formed therein. In some embodiments, the core portion 102 is a substrate such as a bulk semiconductor substrate, silicon on insulator (SOI) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 is doped or undoped.

In some embodiments, the conductive pads 106 are formed on a first surface 102a of the core portion 102 (first surface 102a of interposer structure 100). In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 are formed by forming holes or recesses in the core portion 102 and then filling the recesses with a conductive material. In some embodiments, the recesses are formed by, for example, etching, milling, laser drilling or the like. In some embodiments, the conductive material is formed by an electro-chemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 are formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes formed in the core portion 102.

As illustrated in FIG. 1A, the core portion 102 has a plurality of package regions PKR and a dicing lane DL separating each of the plurality of package regions PKR. The through vias 104 and conductive pads 106 are formed in the core portion 102 within the package regions PKR. In some embodiments, a plurality of semiconductor dies 21 (first semiconductor dies) and a plurality of semiconductor dies 22 (second semiconductor dies) are provided on the interposer structure 100, or on the core portion 102 within the package regions PKR. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In some embodiments, the semiconductor dies 21 and the semiconductor dies 22 may have the same circuitry.

In some embodiments, the semiconductor dies 21 may be major dies, while the semiconductor dies 22 are tributary dies. In some embodiments, the major dies are arranged on the core portion 102 in central locations of each package region PKR, while tributary dies are arranged side-by-side and spaced apart from the major dies. In some embodiments, the tributary dies are arranged aside the major dies, and around or surrounding the major dies. In one embodiment, four or six tributary dies are arranged around one major die per one package region PKR. The disclosure is not limited thereto.

In certain embodiments, the semiconductor dies 21 has a surface area larger than that of the semiconductor dies 22. Also, in some embodiments, the semiconductor dies 21 and the semiconductor dies 22 may be of different sizes, including different surface areas and/or different thicknesses. In some embodiments, the semiconductor dies 21 may be a logic die, including a central processing unit (CPU) die, graphics processing unit (GPU) die, system-on-a-chip (SoC) die, a microcontroller or the like. In some embodiments, the semiconductor dies 21 is a power management die, such as a power management integrated circuit (PMIC) die. In some embodiments, the semiconductor dies 22 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core portion 102 may be appropriately adjusted based on product requirement.

As illustrated in FIG. 1A, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102a of the core portion 102, for example, through flip-chip bonding by way of the electrical connectors 110. Through a reflow process, the electrical connectors 110 are formed between the connecting pads 212, 222 and conductive pads 106, and are physically connecting the semiconductor dies 21, 22 to the core portion 102 of the interposer structure 100. In some embodiments, the electrical connectors 110 are located in between the semiconductor dies 21, 22 and the interposer structure 100. In certain embodiments, semiconductor dies 21, 22 are electrically connected to the through vias 104 and the conductive pads 106 through the electrical connectors 110. In some alternative embodiments, when the semiconductor dies 22 are dummy dies, the semiconductor dies 22 may be attached to the electrical connectors 110 through physical connection without establishing an electrical connection thereto. In other words, the connecting pads 222 of the semiconductor dies 22 may be dummy pads, for example.

In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies 21, 22 and the core portion 102 is solder bonding. In some embodiments, the bonding between the semiconductor dies 21, 22 and the core portion 102 is direct metal-to-metal bonding, such as copper-to-copper bonding.

Figure 1B:
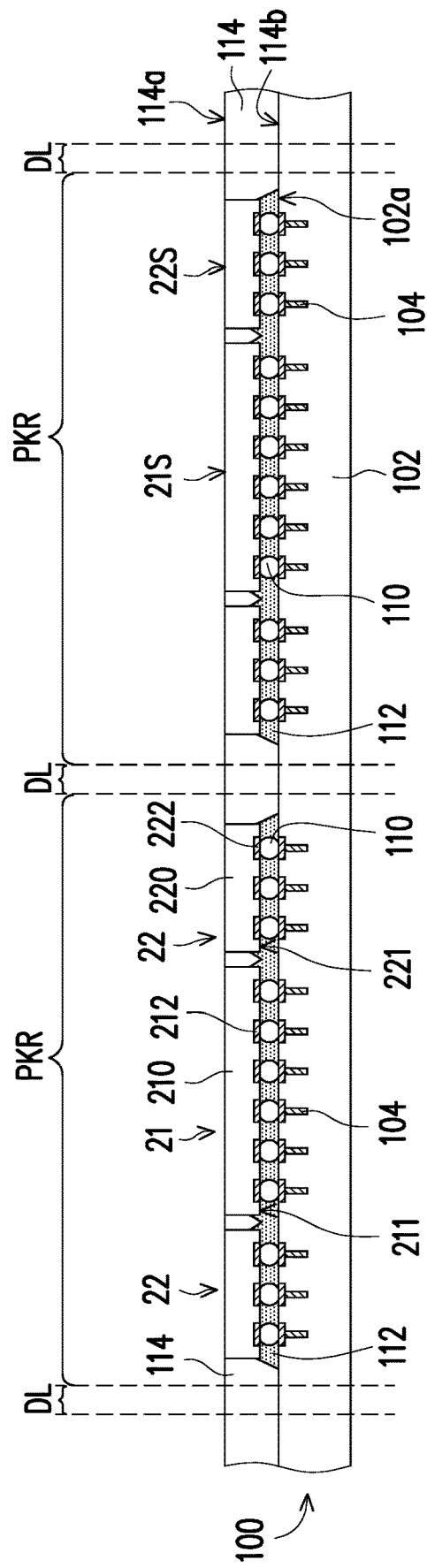

Referring to FIG. 1B, in some embodiments, an underfill structure 112 may be formed to cover the plurality of electrical connectors 110, and to fill up the spaces in between the semiconductor dies 21, 22 and the interposer structure 100. In some embodiments, the underfill structure 112 further cover side walls of the semiconductor dies 21, 22, and is located within the package region PKR. Thereafter, an insulating encapsulant 114 (or molding compound) may be formed over the interposer structure 100 (or over the core portion 102) to cover the underfill structure 112, and to surround the semiconductor dies 21 and 22.

In some embodiments, the insulating encapsulant 114 is formed on the first surface 102a of the core portion 102 in the package regions PKR and over the dicing lanes DL. In some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the electrical connectors 110 are encapsulated by the insulating encapsulant 114. In some embodiments, a planarization process, including grinding or polishing, is performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a top surface 114a of the insulating encapsulant 114. The top surface 114a being opposite to a backside surface 114b of the insulating encapsulant 114, wherein the backside surface 114b is in contact with the core portion 102. In some alternative embodiments, the backside surfaces 21S, 22S of the semiconductor dies 21, 22 are not exposed from the insulating encapsulant 114, and are well protected by the insulating encapsulant 114.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1C:
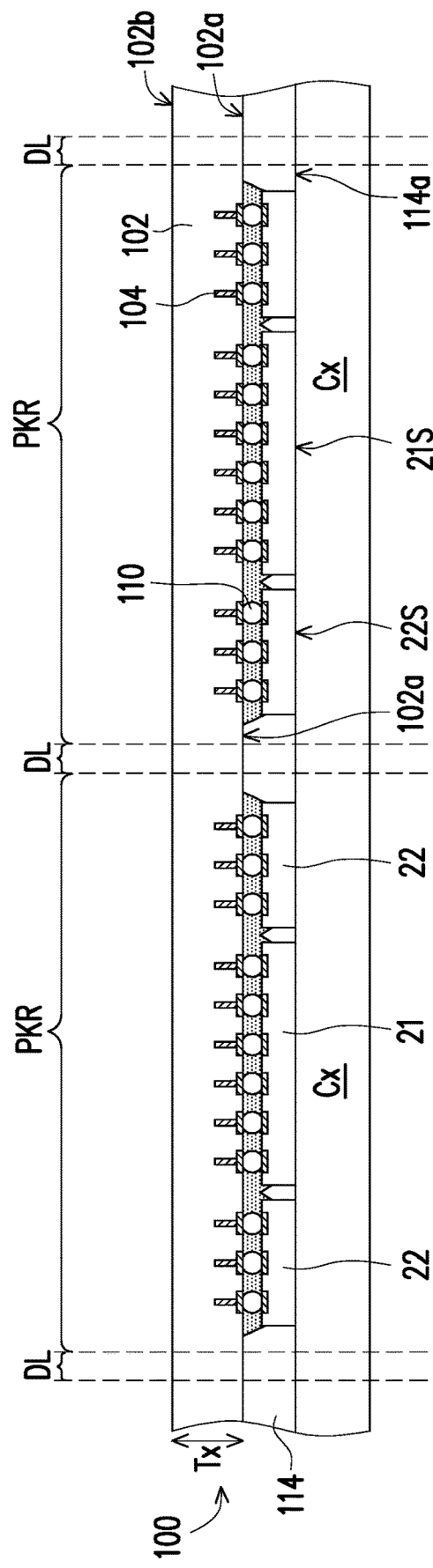

Referring to FIG. 1C, the structure shown in FIG. 1B is turned upside down or flipped, and placed on a carrier Cx, so that the carrier Cx directly contacts the backside surfaces 21S, 22S of the semiconductor dies 21, 22 and the top surface 114a of the insulating encapsulant 114. As shown in FIG. 1C, at this stage of processing, the interposer structure 100 has not been thinned and has a thickness Tx. In other words, the through vias 104 are not revealed, and are embedded in the core portion 102 of the interposer structure 100.

Figure 1D:
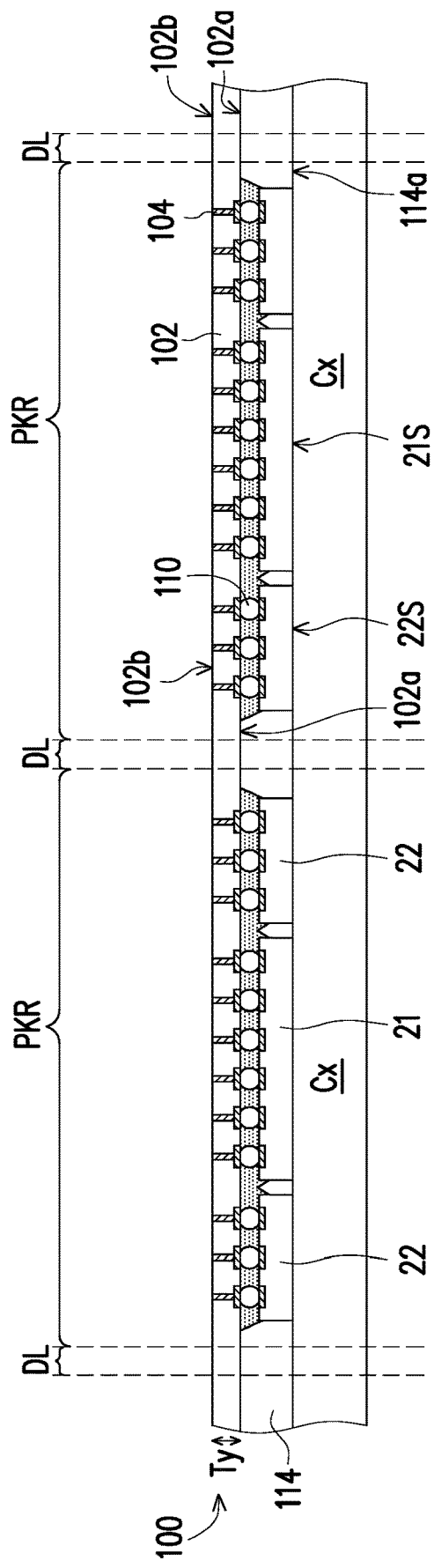

Referring to FIG. 1D, a thinning process is performed to the interposer 100 to partially remove or thin the core portion 102 of the interposer structure 100 until the through vias 104 are exposed and a second surface 102b of the core portion 102 is formed. In some embodiments, the thinning process may include a back-grinding process, a polishing process or an etching process. In some embodiments, after the thinning process, the interposer structure 100 is thinned to a thickness Ty. In some embodiments, a ratio of the thickness Ty to the thickness Tx ranges from about 0.1 to about 0.5.

Figure 1E:
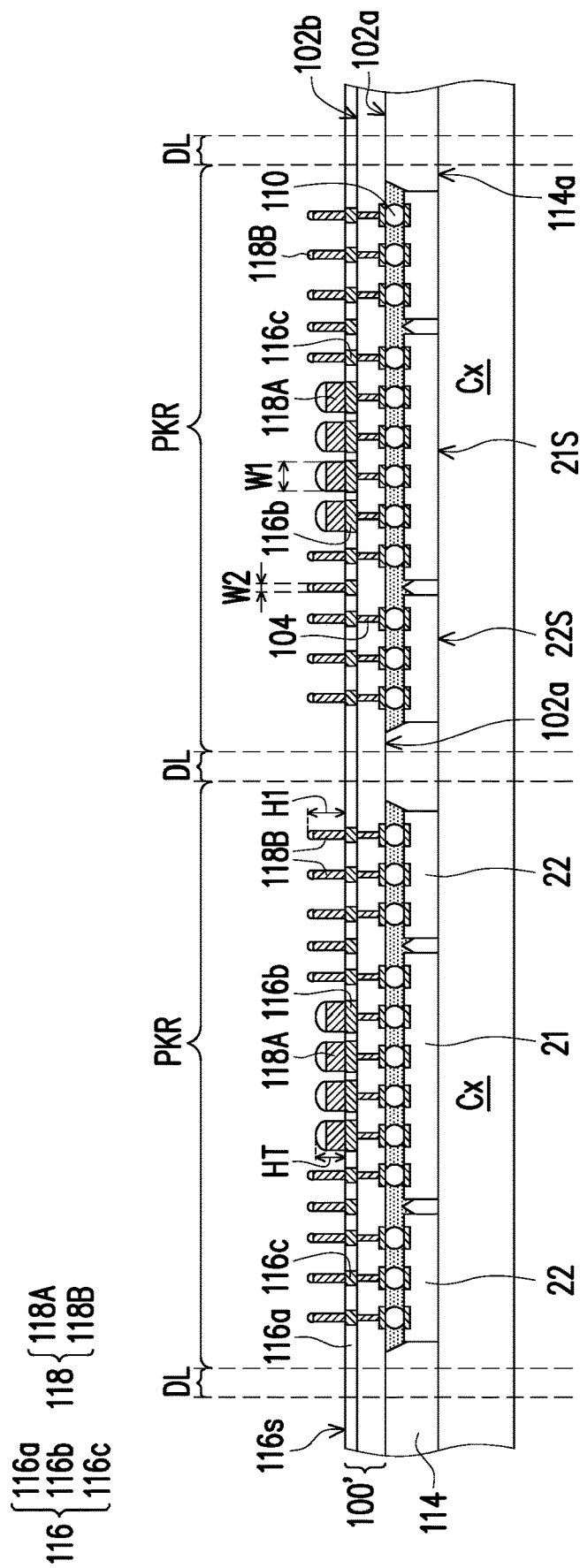

Referring to FIG. 1E, a redistribution structure 116 is formed on the second surface 102b of the core portion 102 in the package region PKR and over the dicing lanes DL. The second surface 102b being opposite to the first surface 102a of the core portion 102. In some embodiments, the redistribution structure 116, the core portion 102, the through vias 104 and conductive pads 106 constitutes the interposer structure 100' (or interconnect structure). In some embodiments, the redistribution structure 116 electrically connects the through vias 104 and/or electrically connects the through vias 104 with external devices. In certain embodiments, the redistribution structure 116 includes at least one dielectric layer 116a, and metallization patterns 116b, 116c embedded in the dielectric layer 116a. In some embodiments, a width of the metallization patterns 116b is greater than a width of the metallization patterns 116c. The metallization patterns 116b, 116c may comprise pads, vias and/or trace lines to interconnect the through vias 104 and to further connect the through vias 104 to one or more external devices. Although one layer of dielectric layer 116a, and one layer of the metallization patterns 116b, 116c is shown in FIG. 1E, it should be noted that the number of layers of the dielectric layer 116a and the metallization patterns 116b, 116c is not limited thereto, and this could be adjusted based on requirement.

In some embodiments, the material of the dielectric layer 116a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116a is formed by spin-coating or deposition, including chemical vapor deposition (CVD), PECVD, HDP-CVD, or the like. In some embodiments, the metallization patterns 116b, 116c include under-metal metallurgies (UBMs). In some embodiments, the formation of the metallization patterns 116b, 116c may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116b, 116c includes copper, aluminum, tungsten, silver, and combinations thereof.

As further illustrated in FIG. 1E, a plurality of bump structures 118 is disposed on the metallization patterns 116b, 116c and are electrically coupled to the through vias 104. For example, the bump structures 118 includes first bump structures 118A and second bump structures 118B that are placed on the top surface 116s of the redistribution structure 116, and electrically connected to the through vias 104 by the metallization patterns 116b, 116c within the package region PKR. In certain embodiments, the first bump structures 118A are positioned on and physically attached to the metallization patterns 116b, while the second bump structures 118B are positioned on and physically attached to the metallization patterns 116c.

In some embodiments, the first bump structures 118A and second bump structures 118B include lead-free solder balls, solder balls, ball grid array (BGA) balls, bumps, C4 bumps or micro bumps. In some embodiments, the first bump structures 118A and second bump structures 118B may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the first bump structures 118A and second bump structures 118B are placed on the redistribution structure 116 by ball placement or the like. In other embodiments, the first bump structures 118A and second bump structures 118B are formed by forming solder-free metal pillars (such as a copper pillar) by sputtering, printing, electroless or electro plating or CVD, and then forming a lead-free cap layer by plating on the metal pillars. The first bump structures 118A and second bump structures 118B may be used to bond to an external device or an additional electrical component. In some embodiments, the first bump structures 118A and second bump structures 118B are used to bond to a circuit substrate, a semiconductor substrate or a packaging substrate.

Figure 1F:
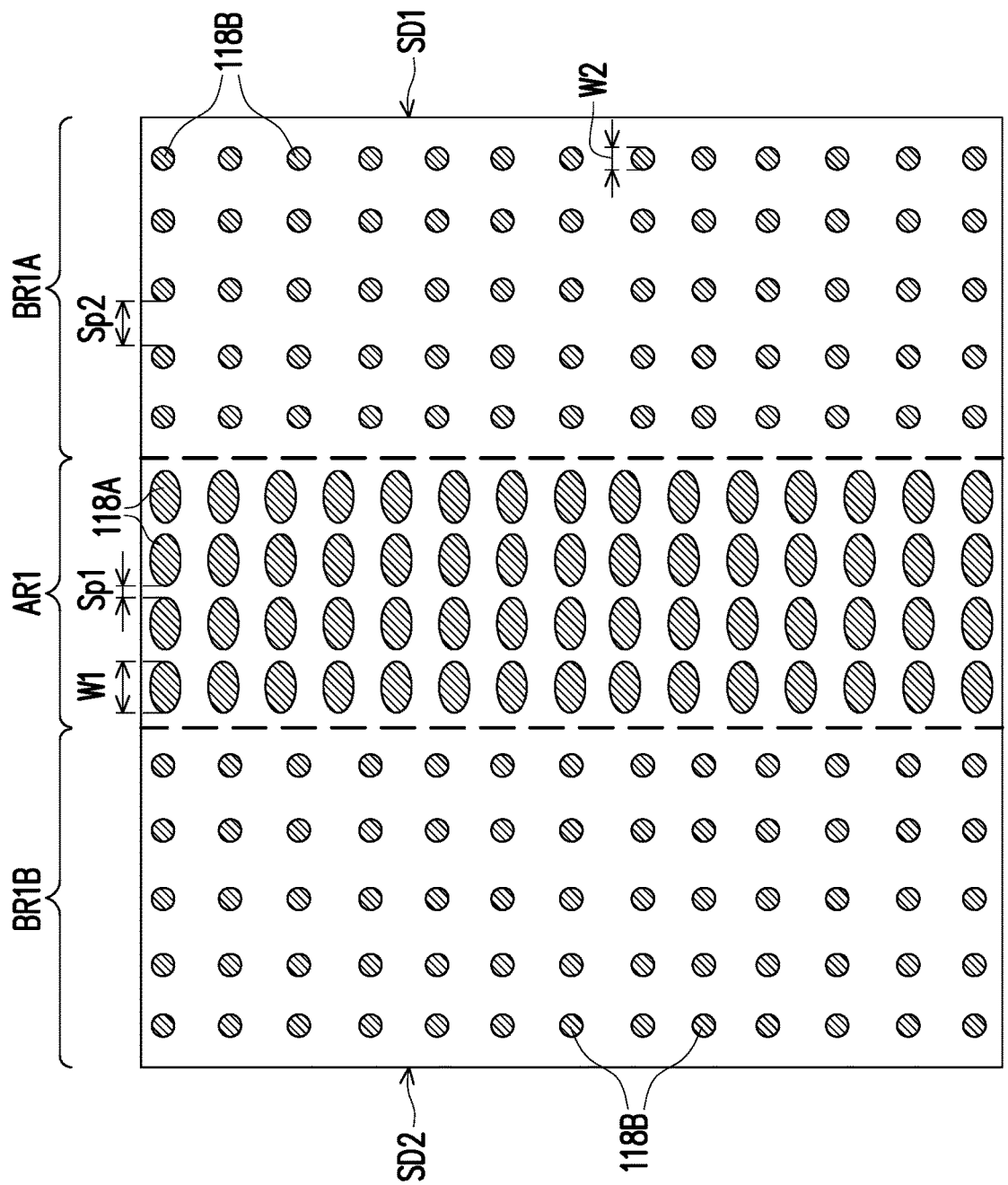

As illustrated in FIG. 1F, which is a top view of the package region PKR shown in FIG. 1E, the first bump structures 118A are disposed on a center region AR1 (or first region) of the interposer structure 100', while the second bump structures 118B are disposed on side regions BR1 (or second region) of the interposer structure 100'. In some embodiments, the side regions BR1 includes a first side region BR1A and a second side region BR1B. For example, the first side region BR1A extends from the center region AR1 to a first peripheral side SD1 of the interposer structure 100'. Similarly, the second side region BR1B extends from the center region AR1 to a second peripheral side SD2 of the interposer structure 100'. The second peripheral side SD2 being opposite to the first peripheral side SD1.

Referring to FIG. 1E and FIG. 1F, the first bump structures 118A and the second bump structures 118B have different heights and different shapes. For example, the first bump structures 118A have an oval shape (or elliptical) while the second bump structures 118B have a circular shape. Furthermore, a maximum width W1 of the first bump structures 118A is greater than a maximum width W2 of the second bump structures 118B. In some embodiments, a height HT of the first bump structures 118A is smaller than a height H1 of the second bump structures 118B. In certain embodiments, the first bump structures 118A disposed in the center region AR1 are spaced apart from one another by a first spacing Sp1, while the second bump structures 118B disposed in the side regions BR1 are spaced apart from one another by a second spacing Sp2. The spacing Sp1 of the first bump structures 118A located in the center region AR1 is smaller than a spacing Sp2 of the second bump structures 118B located in the side regions BR1. In other words, the arrangement of the first bump structures 118A on the interposer structure 100' (or interconnect structure) are more dense than the arrangement of the second bump structures 118B on the interposer structure 100' (or interconnect structure).

Figure 1G:
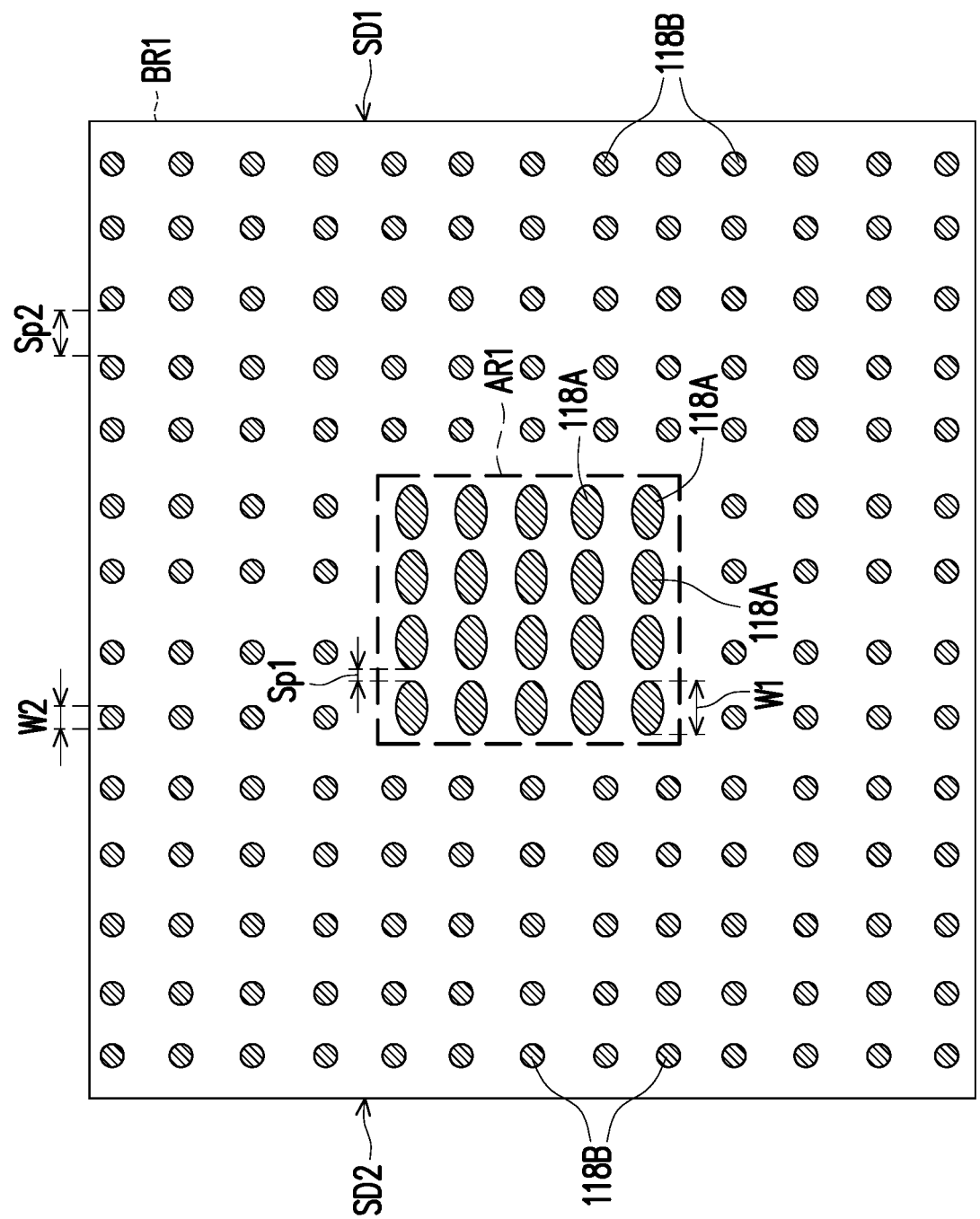

FIG. 1G is an alternative embodiment of a top view of the package region PKR shown in FIG. 1E. In the embodiment shown in FIG. 1F, the side regions BR1 are located on two opposing sides of the center region AR1. However, the disclosure is not limited thereto. As illustrated in FIG. 1G, in some alternative embodiments, the side region BR1 is surrounding the center region AR1. In other words, the second bump structures 118B disposed in the side region BR1 are surrounding and encircling the first bump structures 118A disposed in the center region AR1.

Figure 1H:
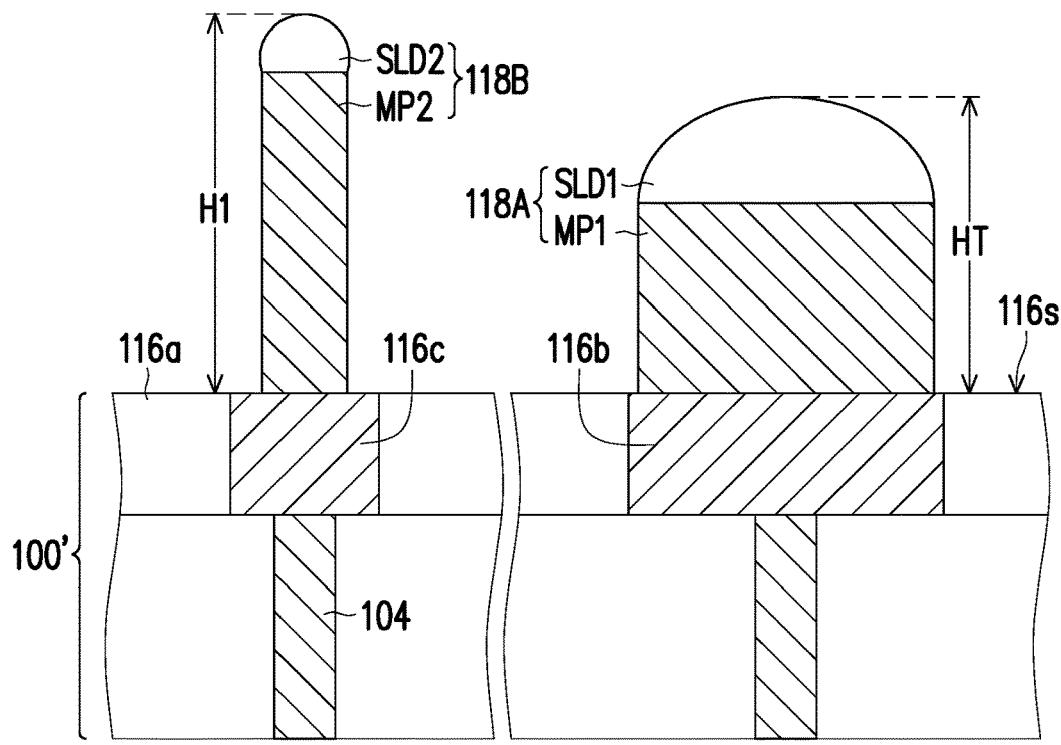
Figure 1I:
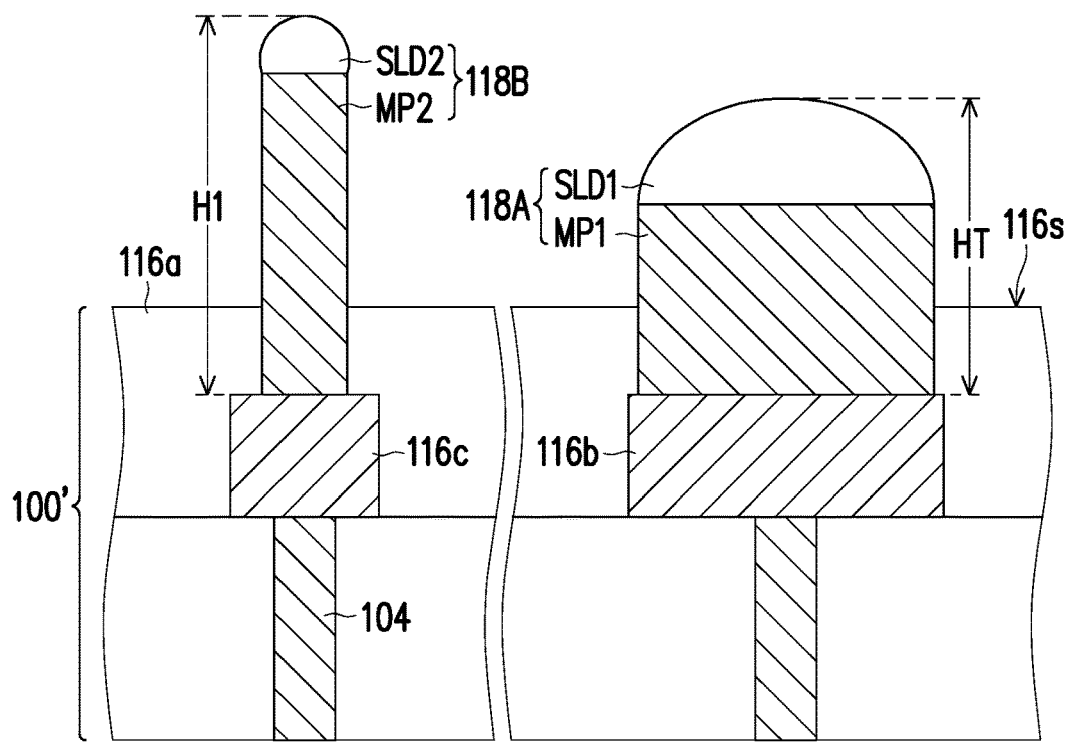

FIG. 1H and FIG. 1I are enlarged views of the first bump structures 118A and the second bump structures 118B according to different embodiments. Referring to FIG. 1H, in one embodiment, the first bump structures 118A and the second bump structures 118B are disposed on the metallization patterns 116b, 116c so that a bottom surface of the first bump structures 118A and the second bump structures 118B are leveled with the top surface 116s of the redistribution structure 116 or leveled with the top surface of the interposer structure 100'. However, the disclosure is not limited thereto. Referring to FIG. 1I, in another embodiment, the first bump structures 118A and the second bump structures 118B are partially covered or surrounded by the dielectric layer 116a of the redistribution structure 116, or partially surrounded by the interposer structure 100'.

In the embodiments of FIG. 1H and FIG. 1I, the height HT of the first bump structures 118A and the height H1 of the second bump structures 118B are defined as a total height of the metal pillars (MP1/MP2) and the solders (SLD1/SLD2) formed thereon. In other words, the height HT and the height H1 are measured from the bottom of the metal pillars (MP1/MP2) that are attached to the underlying metallization patterns 116b, 116c, towards the tip of the solder (SLD1/SLD2). A ratio (HT:H1) between the height HT of the first bump structures 118A to the height H1 of the second bump structures 118B may be in a range of 1:1.1 to 1:1.25, for example. In certain embodiments, the solders (SLD1, SLD2) of the first bump structures 118A and the second bump structures 118B may partially melt upon welding, while the height of the metal pillars (MP1/MP2) is maintained. In other words, the first bump structures 118A and the second bump structures 118B will still maintain their height difference between the height HT and the height H1 after welding. In some embodiments, when excluding the height of the solders (SLD1/SLD2), the height of the metal pillars MP2 of the second bump structures 118B is greater than the height of the metal pillars MP1 of the first bump structures 118A. For example, in one embodiment, the metal pillars MP1 of the first bump structures 118A may have a height range of 70 μm to 95 μm, and the metal pillars MP2 of the second bump structures 118B may have a height range of 85 μm to 110 μm, while the metal pillars MP2 of the second bump structures 118B have the greater height.

Figure 1J:
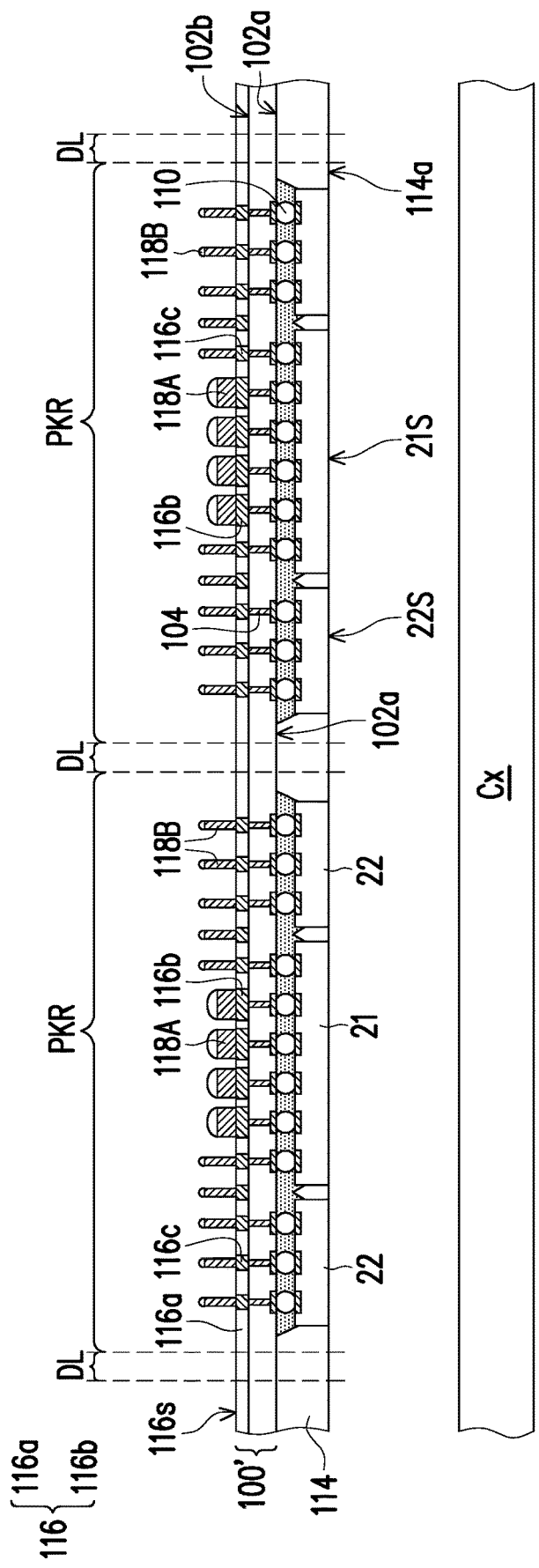

Referring to FIG. 1J, in a subsequent step, after disposing the bump structures 118 on the metallization patterns 116b, 116c, the carrier Cx is de-bonded. For example, the de-bonding process includes projecting a light such as a laser light or an UV light on a debond layer (e.g., light-to-heat-conversion release layer) that is attached to the carrier Cx (not shown), so that the carrier Cx can be easily removed along with the debond layer. In some embodiments, the backside surfaces 21S, 22S of the semiconductor dies 21, 22 are revealed after the de-bonding process.

Figure 1K:
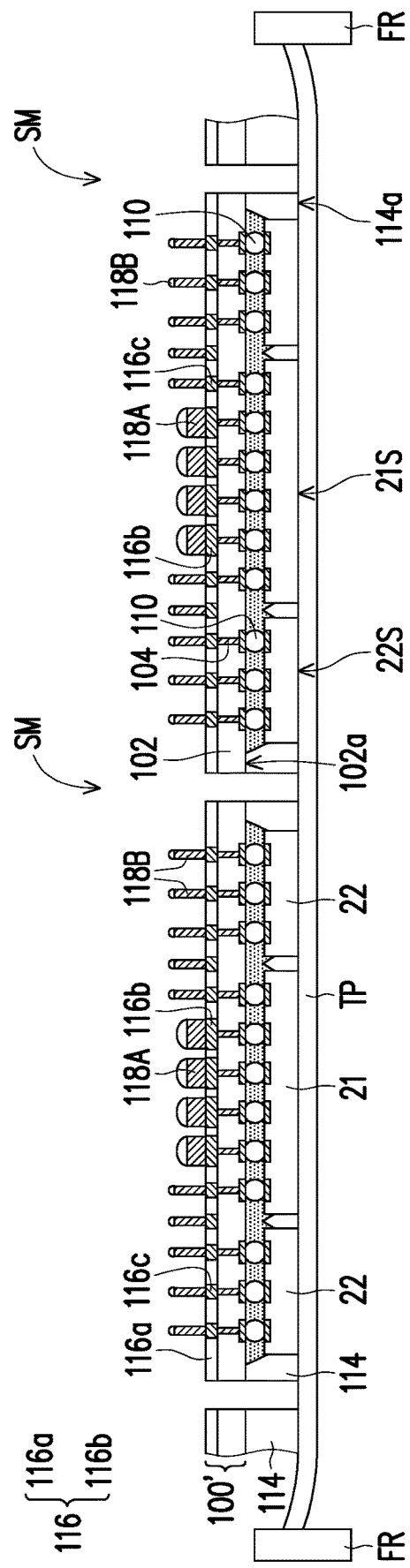

Referring to FIG. 1K, after de-bonding the carrier Cx, the structure shown in FIG. 1J is attached to a tape TP (e.g., a dicing tape) supported by a frame FR. Subsequently, the structure shown in FIG. 1J is diced or singulated along the dicing lanes DL to form a plurality of semiconductor packages SM. For example, the dicing process is performed to cut through the redistribution structure 116, the core portion 102, and the insulating encapsulant 114 to remove portions of the redistribution structure 116, the core portion 102, and the insulating encapsulant 114 along the dicing lanes DL. In some embodiments, the dicing process or the singulation process typically involves dicing with a rotating blade or a laser beam. In other words, the dicing or singulation process is, for example, a laser cutting process, a mechanical sawing process, or other suitable processes. After debonding the carrier Cx, the singulated semiconductor package SM illustrated in FIG. 1L can be obtained.

Figure 1L:
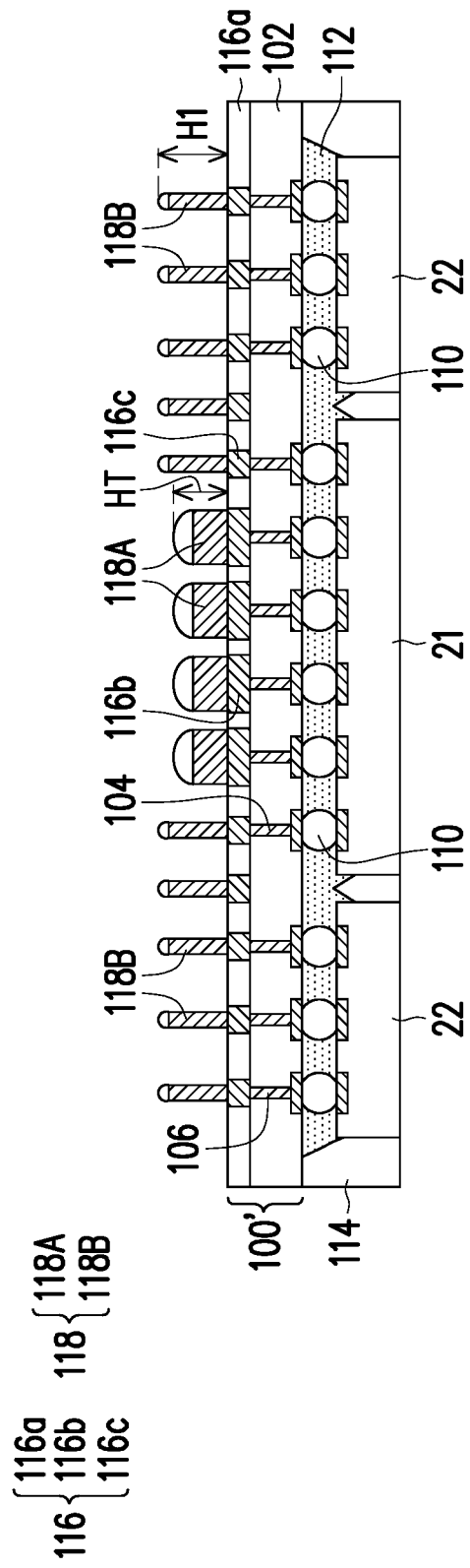
Figure 2:
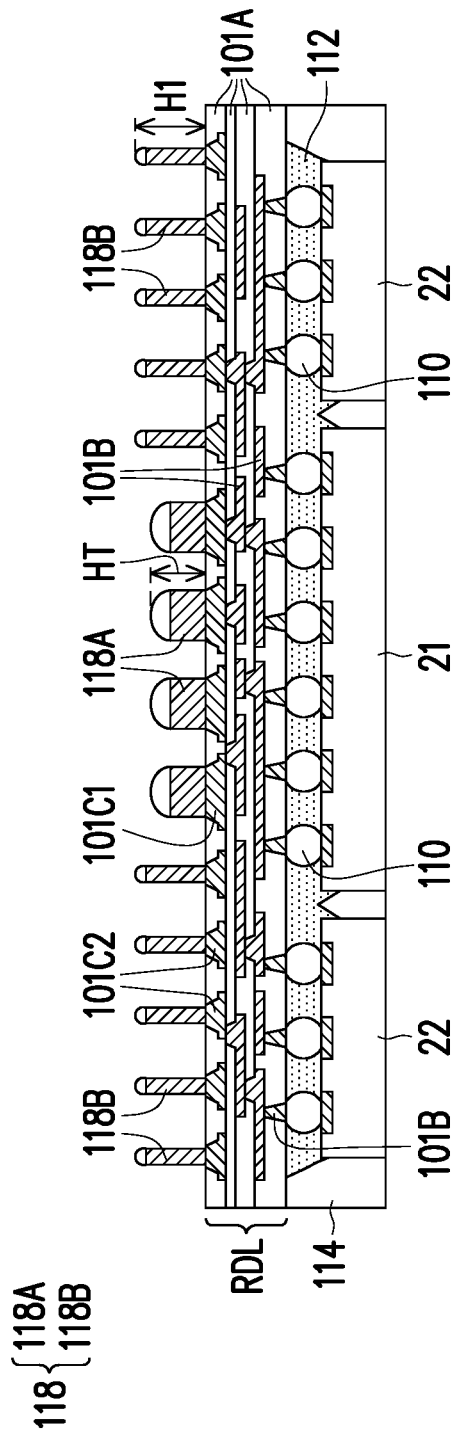
FIG. 2 is a schematic sectional view of a semiconductor package according to some other exemplary embodiments of the present disclosure.

FIG. 2 is a schematic sectional view of a semiconductor package according to some other exemplary embodiments of the present disclosure. The semiconductor package SM2 illustrated in FIG. 2 is similar to the semiconductor package SM illustrated in FIG. 1L. Therefore, the same reference numerals may be used to refer to the same or liked parts, and its detailed description will be omitted herein. The difference between the embodiments is that the interposer structure 100' illustrated in FIG. 1L is replaced with a redistribution layer RDL (interconnect structure) illustrated in FIG. 2. As illustrated in FIG. 2, the redistribution layer RDL is disposed on the insulating encapsulant 114 and electrically connected to the semiconductor dies 21, 22 through the electrical connectors 110.

In some embodiments, the redistribution layer RDL is formed by sequentially forming one or more dielectric layers 101A and one or more conductive layers 101B in alternation. In certain embodiments, the conductive layers 101B are sandwiched between the dielectric layers 101A, and are electrically and physically connected to the electrical connectors 110. In the exemplary embodiment, the numbers of the dielectric layers 101A and the conductive layers 101B included in the redistribution layer RDL is not limited thereto, and may be designated and selected based on the design requirements. For example, the numbers of the dielectric layers 101A and the conductive layers 101B may be one or more than one.

In some embodiments, the material of the dielectric layers 101A is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers DL is formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 101B is made of conductive materials formed by electroplating or deposition, such as aluminum, titanium, copper, nickel, tungsten, and/or alloys thereof, which may be patterned using a photolithography and etching process. In some embodiments, the conductive layer 101B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, the redistribution layer RDL further includes a plurality of conductive pads 101C1, 101C2 disposed on the conductive layers 101B for electrically connecting with the bump structures 118. For example, the conductive pads 101C1 with greater width is connected to the first bump structures 118A, while the conductive pads 101C2 with smaller width is connected to the second bump structures 118B. In some embodiments, the materials of the conductive pads 101C1, 101C2 may include copper, nickel, titanium, tungsten, or alloys thereof or the like, and may be formed by an electroplating process, for example. The number of conductive pads 101C1, 101C2 are not limited in this disclosure, and may be selected based on the design layout. In some alternative embodiments, the conductive pads 101C1, 101C2 may be omitted. In other words, the bump structures 118 formed in subsequent steps may be directly disposed on the conductive layers 101B of the redistribution layer RDL.

Figure 3A:
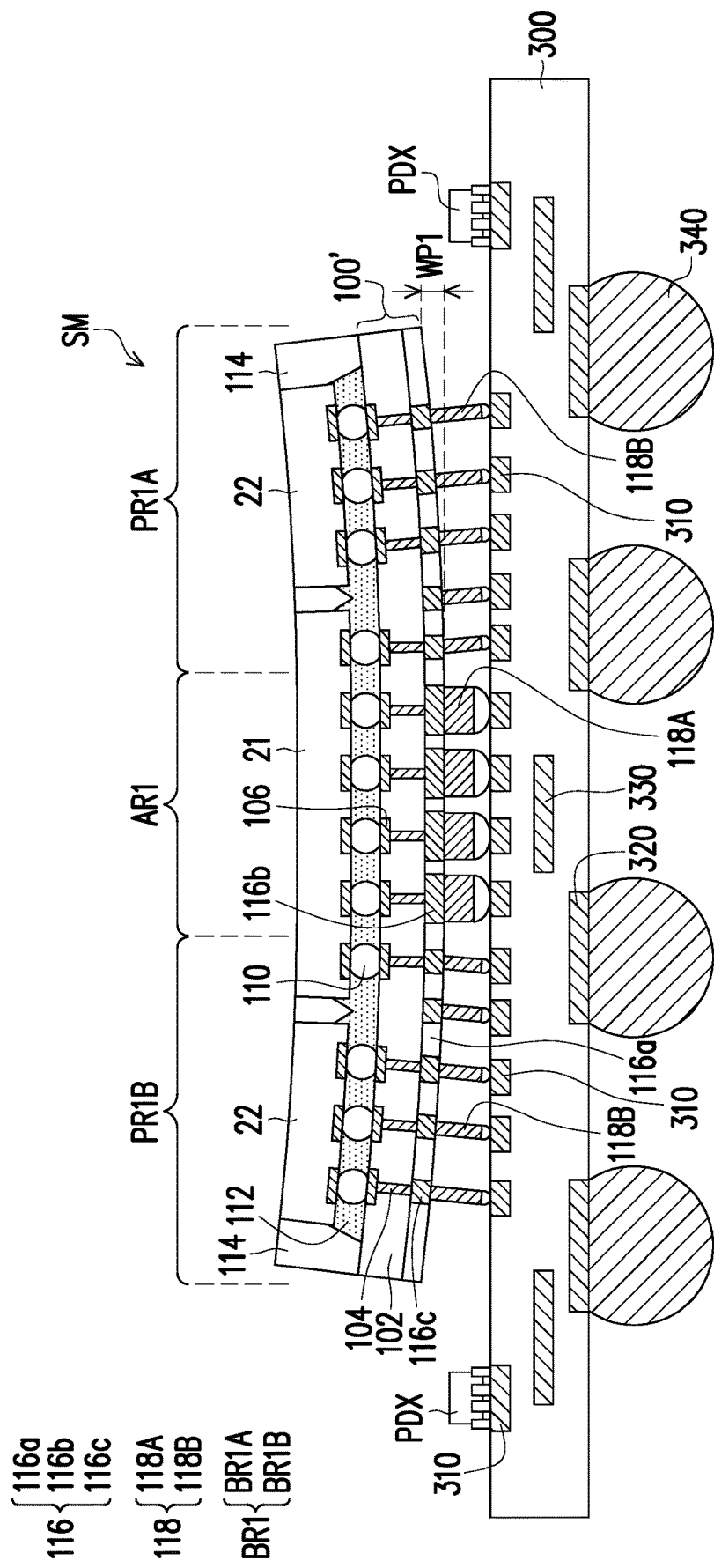
FIG. 3A to FIG. 3C are schematic sectional views of various stages in a method of fabricating a package structure according to some exemplary embodiments of the present disclosure.
Figure 3B:
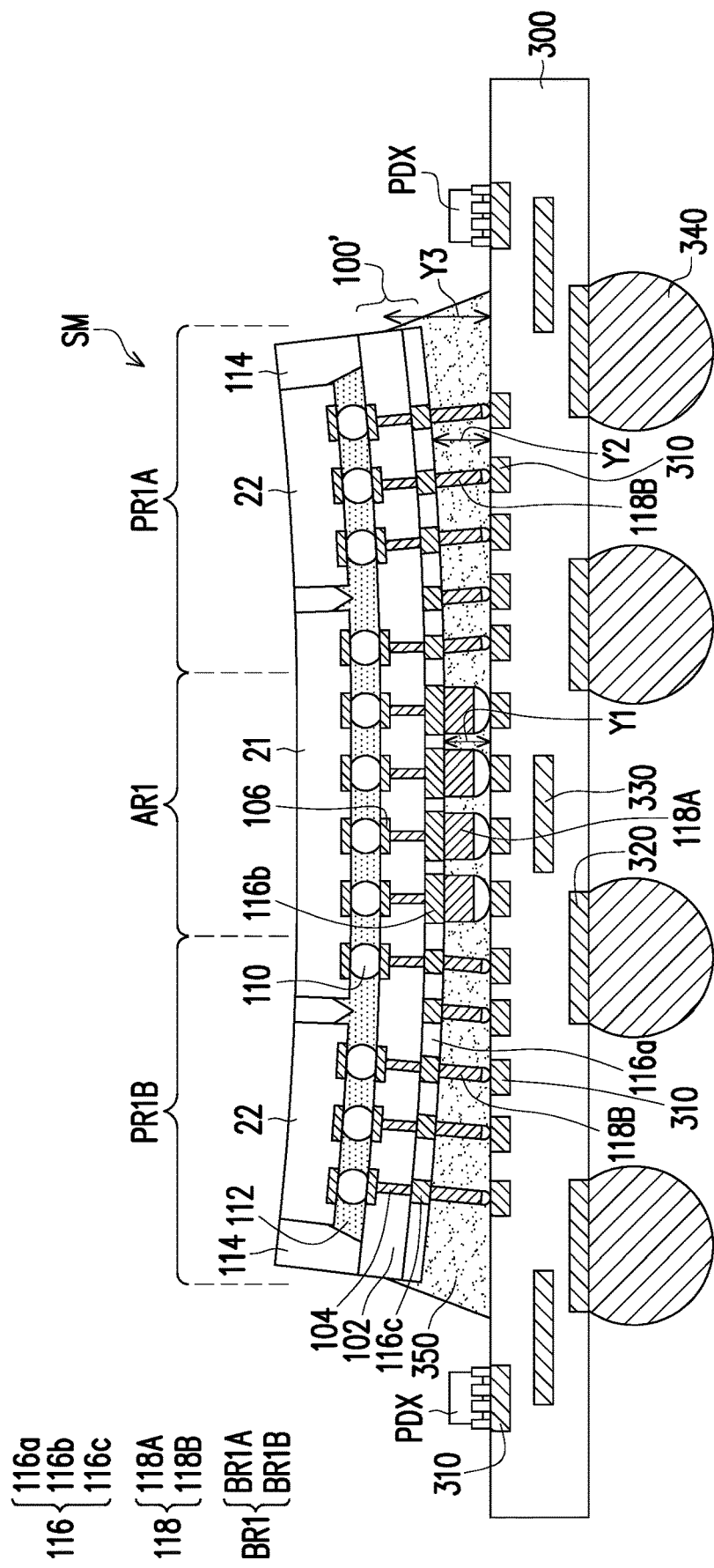
Figure 3C:
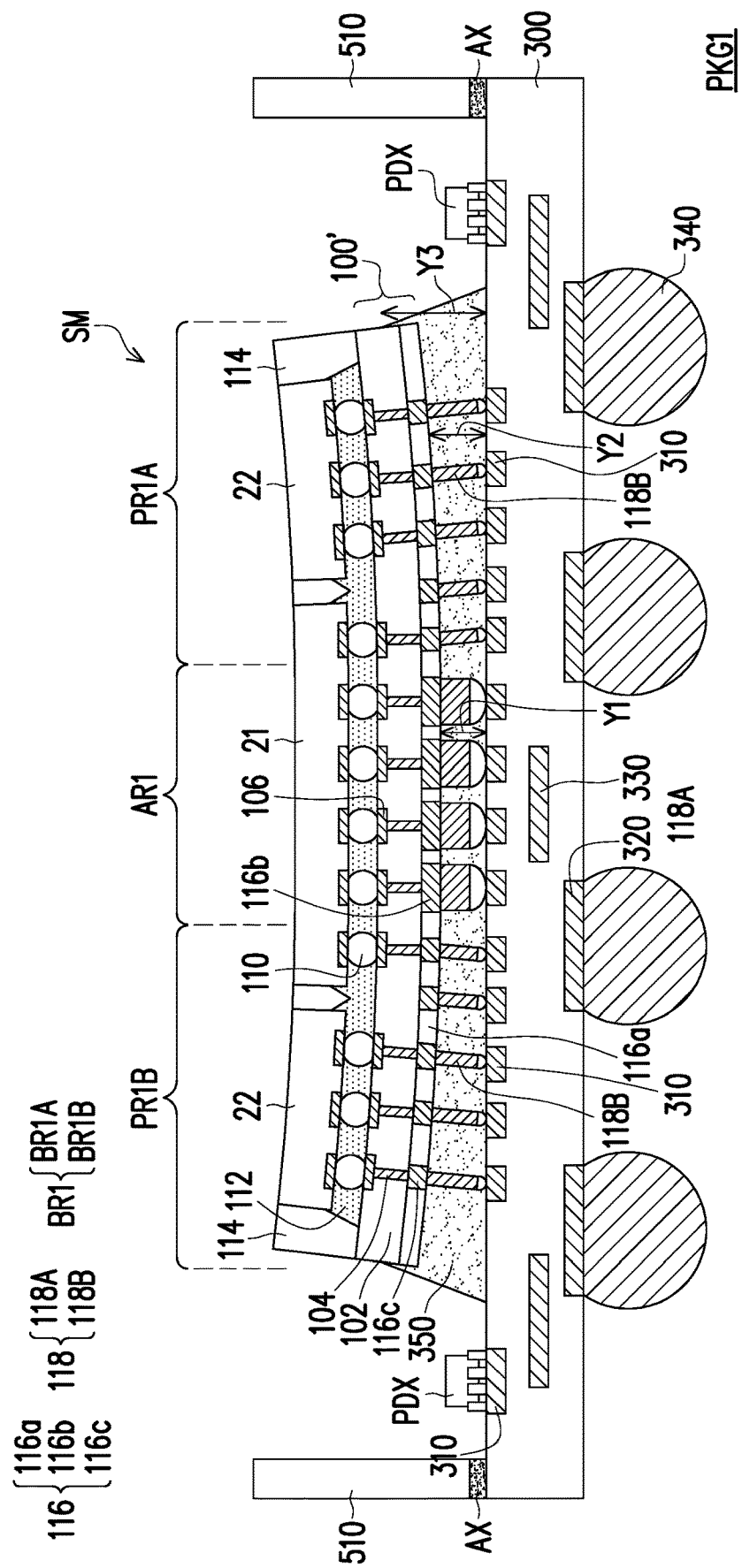

FIG. 3A to FIG. 3C are schematic sectional views of various stages in a method of fabricating a package structure according to some exemplary embodiments of the present disclosure. Referring to FIG. 3A, in some embodiments, the semiconductor package SM obtained in FIG. 1L is mounted or attached onto a circuit substrate 300 through the bump structures 118 (first and second bump structures 118A, 118B). In some embodiments, the circuit substrate 300 includes contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

In the exemplary embodiment, the semiconductor package SM (or the interposer structure 100') has a smile warpage. For example, in a case of having the smile warpage, the center region AR1 of the semiconductor package SM is protruding towards the circuit substrate 300, while the side regions BR1 are bent outwards away from the circuit substrate 300. Furthermore, a maximum height difference WP1 at the top surface 116s of the redistribution structure 116 measured from the center region AR1 to the boundary of the side regions BR1 of the semiconductor package SM defines the level of its warpage.

In some embodiments, when the height difference WP1 or warpage of the semiconductor package SM is equal to or greater than 45 μm, then the maximum width W1 of the first bump structures 118A and the maximum width W2 of the second bump structures 118B fulfills the following relationship: $W1>W2 \geq 0.90*W1$. Furthermore, when the height difference WP1 or warpage of the semiconductor package SM is less than 45 μm, and the maximum width W1 of the first bump structures 118A and the maximum width W2 of the second bump structures 118B fulfills the following relationship: $0.90*W1>W2 \geq 0.8*W1$. By designing the heights and widths of the first bump structures 118A and the second bump structures 118B to fulfill the above relationship, when bonding the semiconductor package SM to the circuit substrate 300, the warpage problem may be compensated and the cold joint problem may be prevented. Overall, a reliability of the package structure may be improved.

In the exemplary embodiment, the first bump structures 118A and the second bump structures 118B are designed to have different heights and width to overcome the warpage problem of the interposer structure 100' upon attachment to the circuit substrate 300. It is noted that this concept may also be applied to the electrical connectors 110. For example, when the semiconductor dies 21 and 22 have a certain warpage, the electrical connectors 110 may also be designed to have different heights. For example, in one embodiment, the first semiconductor die 21 may have electrical connectors 110 that includes a first electrical connector and a second electrical connector, whereby the second electrical connector has a smaller width and greater height. The height and width difference between the first electrical connector and the second electrical connector may be used to compensate for the presence of any warpage on the first semiconductor die 21.

Furthermore, in some embodiments, the semiconductor package SM is bonded to the circuit substrate 300 through physically connecting the bump structures 118 and the contact pads 310 to form a stacked structure. In certain embodiments, the semiconductor package SM is electrically connected to the circuit substrate 300. In some embodiments, the circuit substrate 300 is such as an organic flexible substrate or a printed circuit board. In such embodiments, the bump structures 118 are, for example, chip connectors. After physically connecting the bump structures 118 to the contact pads 310, the solders (SLD1/SLD2) of the first bump structures 118A and the second bump structures 118B may partially melt upon welding, while the heights of the metal pillars (MP1/MP2) are maintained. However, the height difference between the first bump structures 118A and the second bump structures 118B are still kept in a ratio range of 1:1.1 to 1:1.25 after attachment. In some alternative embodiments, the circuit substrate 300 may include optional connection bumps (not shown) located on the contact pads 310. In such embodiment, the bump structures 118 are physically attached to the connection bumps to be electrically connected to the circuit substrate 300.

In some embodiments, a plurality of conductive balls 340 are respectively formed on the substrate 300. As illustrated in FIG. 3A, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the semiconductor package SM (e.g. the semiconductor dies 21 and 22 included therein). In some embodiments, the conductive balls 340 are, for example, solder balls or BGA balls. In some embodiments, the semiconductor package SM is bonded to the circuit substrate 300 through physically connecting the bump structures 118 and the contact pads 310 of the circuit substrate 300 by a chip on wafer on substrate (CoWoS) packaging processes. In addition, as illustrated in FIG. 3A, passive devices PDX (integrated passive device or surface mount devices) may be mounted on the circuit substrate 300. For example, the passive devices PDX may be mounted on the contact pads 310 of the circuit substrate 300 through a soldering process. The disclosure is not limited thereto. In certain embodiments, the passive devices PDX may be mounted on the circuit substrate surrounding the semiconductor package SM. In some alternative embodiments, the passive devices PDX are omitted.

Referring to FIG. 3B, in a subsequent step, an underfill structure 350 is formed to fill up the spaces in between the circuit substrate 300 and the semiconductor package SM. In certain embodiments, the underfill structure 350 fills up the spaces in between adjacent bump structures 118 and covers the bump structures 118. For example, the underfill structure 350 surrounds the bump structures 118. In some embodiments, the underfill structure 350 covering the center region AR1 of the interposer structure 100' has a first average height Y1, while the underfill structure 350 covering the side regions BR1 (BR1A, BR1B) has a second average height Y2. In certain embodiments, the first average height Y1 may correspond to the height of the first bump structures 118A (including pillar and solders) after attachment, while the second average height Y2 may correspond to the height of the second bump structures 118B (including pillar and solders) after attachment. In some other embodiments, when optional connection bumps are used for connection, the underfill structure 350 may further cover the optional connection bumps. Thus, in such embodiment, the first average height Y1 may correspond to the height of the first bump structures 118A and the optional connection bumps after attachment, while the second average height Y2 may correspond to the height of the second bump structures 118B and the optional connection bumps after attachment.

Furthermore, the underfill structure 350 covering the sidewalls of the semiconductor package SM has a maximum height Y3. In the exemplary embodiment, the first average height Y1 is smaller than the second average height Y2, and the second average height Y2 is smaller than the maximum height Y3. In some embodiments, a ratio of the first average height Y1 to the second average height Y2 is in a range of 1:1.1 to 1:1.25. In some embodiments, the passive devices PDX is exposed by the underfill structure 350, and kept a distance apart from the underfill structure 350. In other words, the underfill structure 350 does not cover the passive devices PDX.

Referring to FIG. 3C, in a subsequent step, a ring structure 510 is attached to the circuit substrate 300 through an adhesive Ax. In some embodiments, the ring structure 510 is a stiffener ring made of a metallic material, for example. In certain embodiments, the ring structure 510 is disposed on the circuit substrate 300 to surround the semiconductor package SM. After attaching the ring structure 510 onto the circuit substrate 300, a package structure PKG1 according to some embodiments of the present disclosure may be accomplished.

Figure 4A:
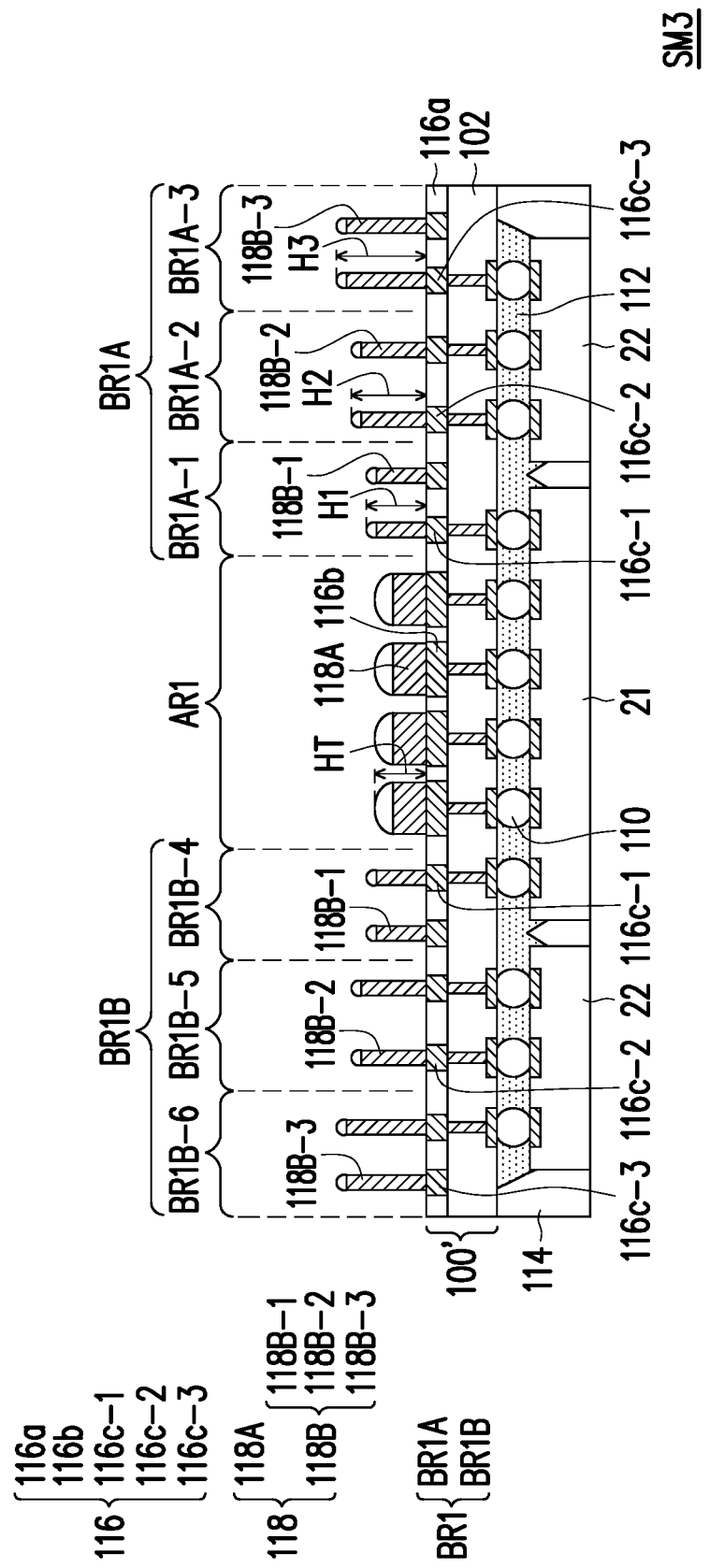
FIG. 4A and FIG. 4B are schematic sectional and top views of a semiconductor package according to some other embodiments of the present disclosure.
Figure 4B:
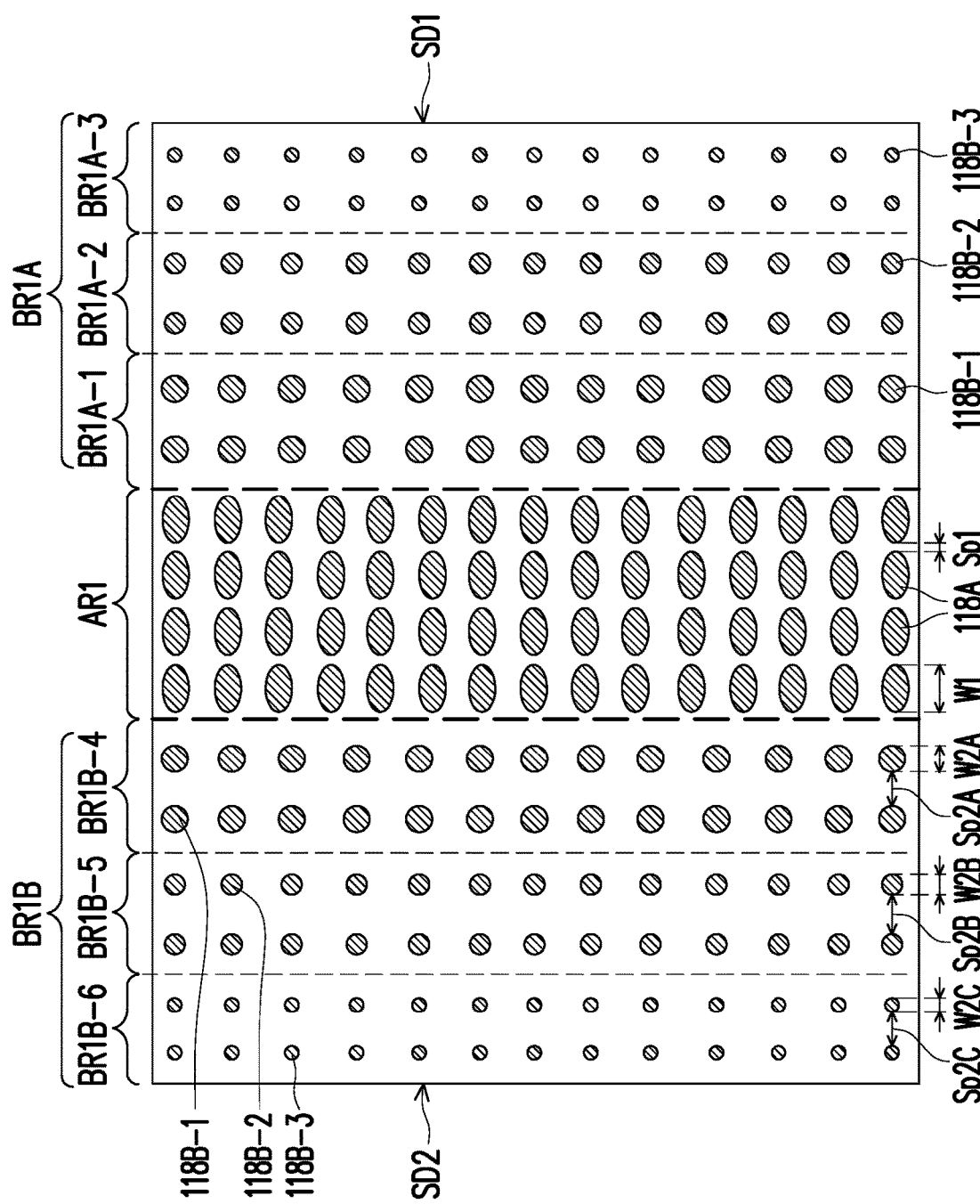

FIG. 4A and FIG. 4B are schematic sectional and top views of a semiconductor package according to some other embodiments of the present disclosure. The semiconductor package SM3 illustrated in FIG. 4A and FIG. 4B is similar to the semiconductor package SM illustrated in FIG. 1L. Therefore, the same reference numerals are used to refer to the same or liked parts, and its detailed description will be omitted herein.

Referring to FIG. 4A, and from the top view of the semiconductor package SM3 shown in FIG. 4B, the side regions BR1 includes a first side region BR1A and a second side region BR1B. In some embodiments, the first side region BR1A includes a first sub-region BR1A-1, a second sub-region BR1A-2 and a third sub-region BR1A-3. The first sub-region BR1A-1 is joined with the center region AR1, the third sub-region BR1A-3 is located at a first peripheral side SD1 of the semiconductor package SM3, and the second sub-region BR1A-2 is located in between the first sub-region BR1A-1 and the third sub-region BR1A-3. Furthermore, the second side region BR1B includes a fourth sub-region BR1B-4, a fifth sub-region BR1B-5 and a sixth sub-region BR1B-6. The fourth sub-region BR1B-4 is joined with the center region AR1, the sixth sub-region BR1B-6 is located at a second peripheral side SD2 of the semiconductor package SM3 opposite to the first peripheral side SD1, and the fifth sub-region BR1B-5 is located in between the fourth sub-region BR1B-4 and the sixth sub-region BR1B-6.

In the exemplary embodiment, the second bump structures 118B further includes first portion bumps 118B-1, second portion bumps 118B-2 and third portion bumps 118B-3. The first portion bumps 118B-1 are located in the first sub-region BR1A-1 and the fourth sub-region BR1B-4 and having a height of H1. The second portion bumps 118B-2 are located in the second sub-region BR1A-2 and the fifth sub-region BR1B-5 and having a height of H2. The third portion bumps 118B-3 are located in the third sub-region BR1A-3 and the sixth sub-region BR1B-6 and having a height of H3, wherein H1<H2<H3. In some embodiments, the first bump structures 118A are disposed on the metallization patterns 116b. Furthermore, the first portion bumps 118B-1 are disposed on the metallization patterns 116c-1, the second portion bumps 118B-2 are disposed on the metallization patterns 116c-2, while the third portion bumps 118B-2 are disposed on the metallization patterns 116c-3.

As further illustrated in FIG. 4B, the first bump structures 118A have an oval shape (or elliptical), while the second bump structures 118B have a circular shape. However, as shown in FIG. 4B, the first portion bumps 118B-1, the second portion bumps 118B-2 and the third portion bumps 118B-3 of the second bump structures 118B have different sizes or widths. For example, the first portion bumps 118B-1 have a width of W2A, the second portion bumps 118B-2 have a width of W2B, and the third portion bumps 118B-3 have a width of W2C, wherein W2C<W2B<W2A. In addition, the widths W2A~W2C of the second bump structures 118B are smaller than the maximum width W1 of the first bump structure 118A. In some embodiments, the first portion bumps 118B-1 are arranged in the first sub-region BR1A-1 and the fourth sub-region BR1B-4 with a spacing of Sp2A. The second portion bumps 118B-2 are arranged in the second sub-region BR1A-2 and the fifth sub-region BR1B-5 with a spacing of Sp2B. The third portion bumps 118B-3 are arranged in third sub-region BR1A-3 and the sixth sub-region BR1B-6 with a spacing of Sp2C, wherein Sp2C>Sp2B>Sp2A. Furthermore, the spacings Sp2A~Sp2C of the second bump structures 118B in the side regions BR1 are greater than the first spacing Sp1 of the first bump structures 118A in the center region AR1.

In the exemplary embodiment, the semiconductor package SM3 illustrated in FIG. 4A and FIG. 4B may be mounted or attached onto a circuit substrate 300 in a similar way as shown in FIG. 3A to FIG. 3C. In case the semiconductor package SM3 has a smile warpage, since the bump structures 118 are arranged to have increasing heights and decreasing widths from the center region AR1 to the side regions BR1, the warpage problem may be compensated and the cold joint problem may be prevented. Overall, a reliability of the package structure may be improved.

Figure 5A:
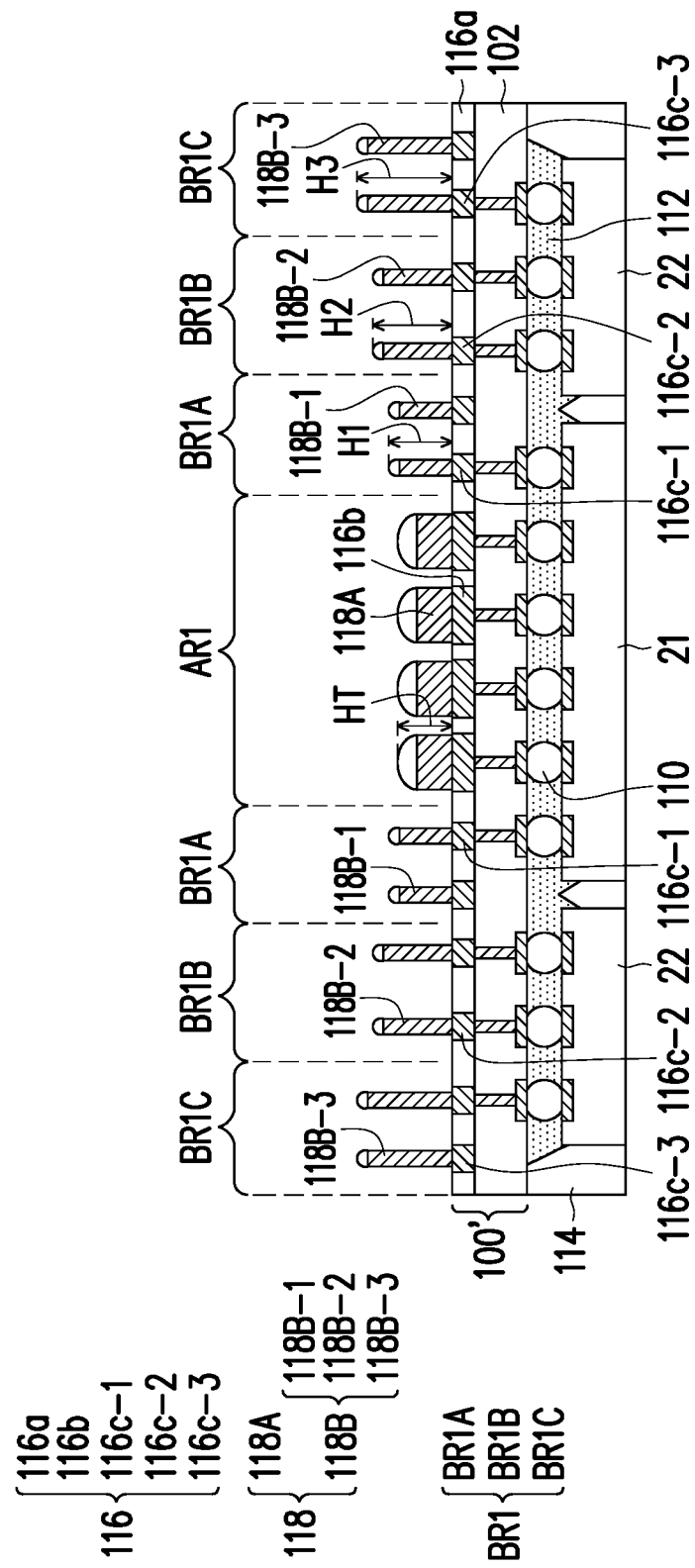
FIG. 5A and FIG. 5B are schematic sectional and top views of a semiconductor package according to some other embodiments of the present disclosure.
Figure 5B:
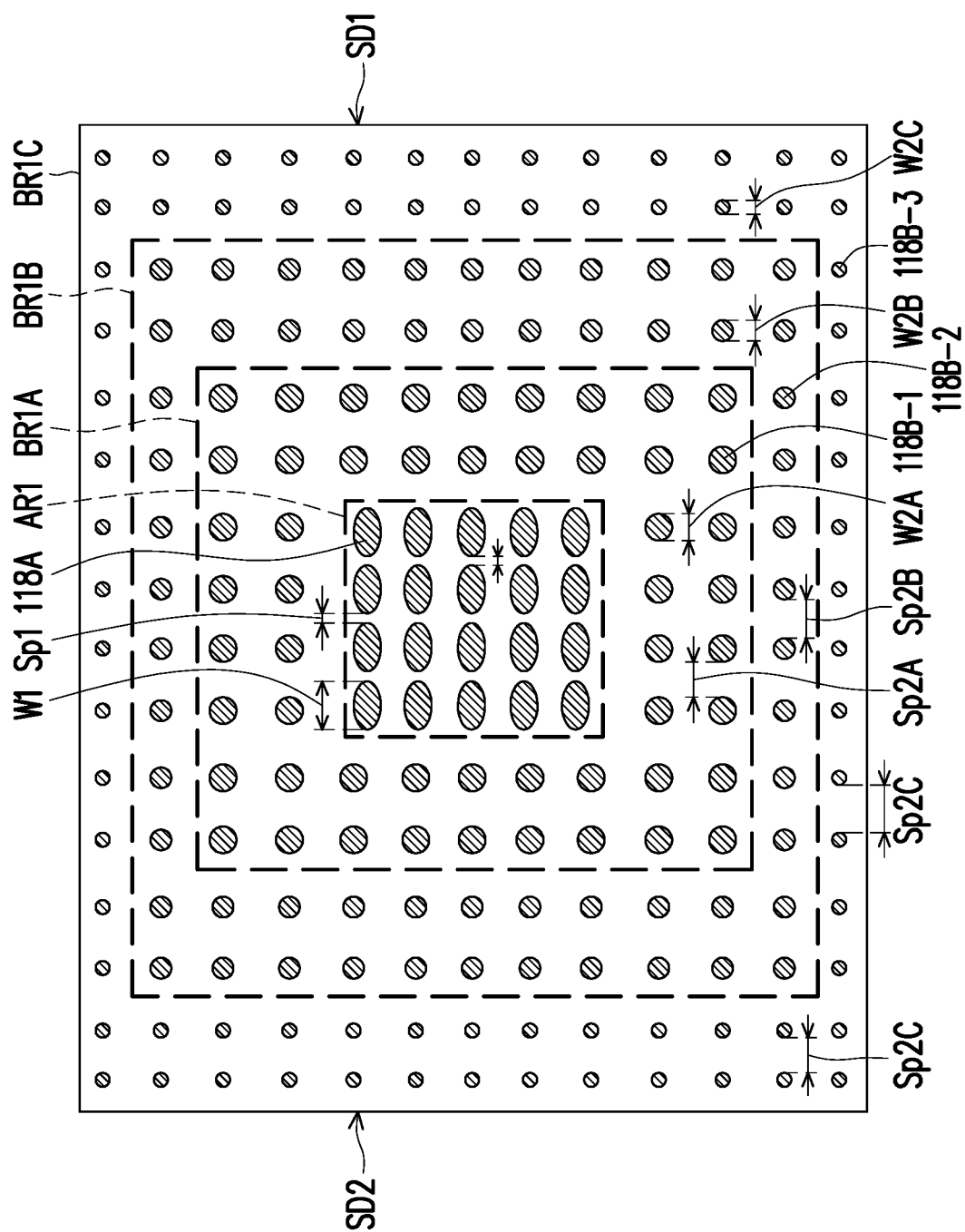

FIG. 5A and FIG. 5B are schematic sectional and top views of a semiconductor package according to some other embodiments of the present disclosure. The semiconductor package SM4 illustrated in FIG. 5A and FIG. 5B is similar to the semiconductor package SM3 illustrated in FIG. 4A and FIG. 4B. Therefore, the same reference numerals are used to refer to the same or liked parts, and its detailed description will be omitted herein. The difference between the embodiments is in the arrangement of the first portion bumps 118B-1, the second portion bumps 118B-2 and the third portion bumps 118B-3 in different regions.

Referring to FIG. 5A, and from the top view of the semiconductor package SM4 shown in FIG. 5B, the side region BR1 of the interposer structure 100' includes a first side region BR1A, a second side region BR1B and a third side region BR1C. The first side region BR1A is joined with the center region AR1 and encircling the center region AR1. The second side region BR1B is joined with the first side region BR1A and encircling the first side region BR1A. The third side region BR1C is encircling the second side region BR1B and located at peripheral sides of the semiconductor package SM4. In some embodiments, the first portion bumps 118B-1 are located in the first side region BR1A and having a height of H1. The second portion bumps 118B-2 are located in the second side region BR1B and having a height of H2. Furthermore, the third portion bumps 118B-3 are located in the third side region and having a height of H3, wherein H1<H2<H3.

In the exemplary embodiment, the semiconductor package SM4 illustrated in FIG. 5A and FIG. 5B may be mounted or attached onto a circuit substrate 300 in a similar way as shown in FIG. 3A to FIG. 3C. In case the semiconductor package SM4 has a smile warpage, since the bump structures 118 (118A, 118B) are arranged to have increasing heights and decreasing widths from the center region AR1 to the side regions BR1 (BR1A, BR1B and BR1C), the warpage problem may be compensated and the cold joint problem may be prevented. Overall, a reliability of the package structure may be improved.

Figure 6A:
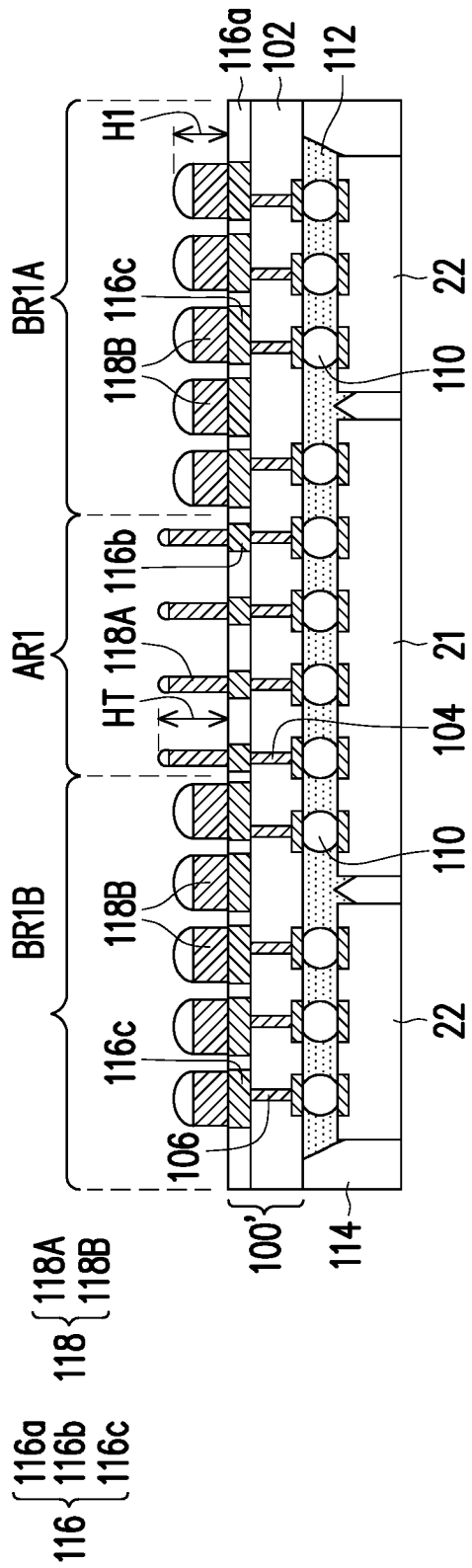

FIG. 6A and FIG. 6B are schematic sectional and top views of a semiconductor package according to some other embodiments of the present disclosure. The semiconductor package SM5 illustrated in FIG. 6A and FIG. 6B is similar to the semiconductor package SM illustrated in FIG. 1L. Therefore, the same reference numerals are used to refer to the same or liked parts, and its detailed description will be omitted herein. The difference between the embodiments is in the design of the bump structures 118.

As illustrated in FIG. 6A, and from the top view of the semiconductor package SM5 shown in FIG. 6B, the first bump structures 118A are disposed on a center region AR1 of the interposer structure 100', while the second bump structures 118B are disposed on side regions BR1 of the interposer structure 100'. In some embodiments, the side regions BR1 includes the first side region BR1A and the second side region BR1B. Referring to FIG. 6A and FIG. 6B, the first bump structures 118A have a circular shape, while the second bump structures 118B have an oval shape (or elliptical). Furthermore, a maximum width W1 of the first bump structures 118A is smaller than a maximum width W2 of the second bump structures 118B. In some embodiments, a height HT of the first bump structures 118A is greater than a height H1 of the second bump structures 118B. In certain embodiments, the first bump structures 118A disposed in the center region AR1 are spaced apart from one another by a first spacing Sp1, while the second bump structures 118B disposed in the side regions BR1 are spaced apart from one another by a second spacing Sp2. The spacing Sp1 of the first bump structures 118A located in the center region AR1 is greater than a spacing Sp2 of the second bump structures 118B located in the side regions BR1. In other words, the arrangement of the first bump structures 118A on the interposer structure 100' (or interconnect structure) are less dense than the arrangement of the second bump structures 118B on the interposer structure 100' (or interconnect structure).

Figure 7A:
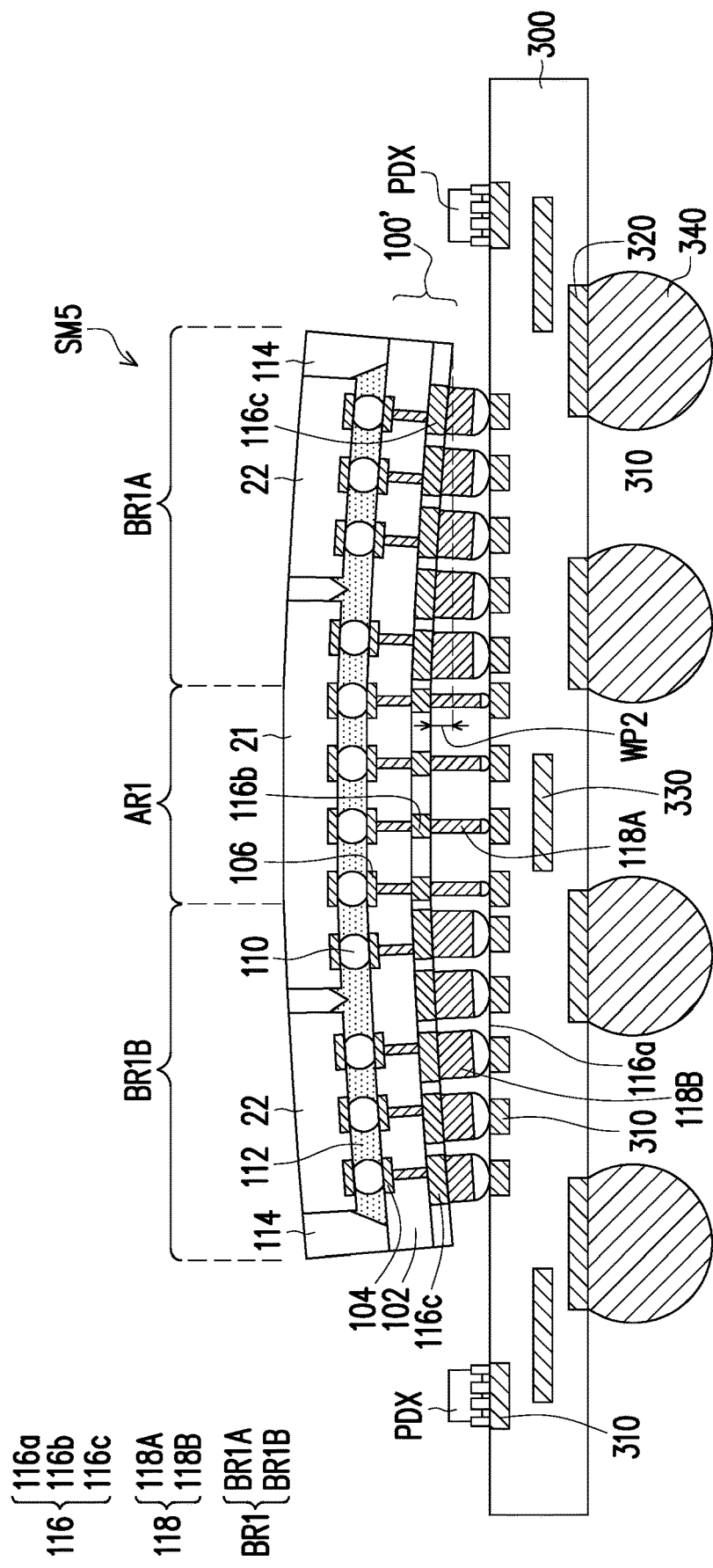
FIG. 7A to FIG. 7C are schematic sectional views of various stages in a method of fabricating a package structure according to some other exemplary embodiments of the present disclosure.
Figure 7B:
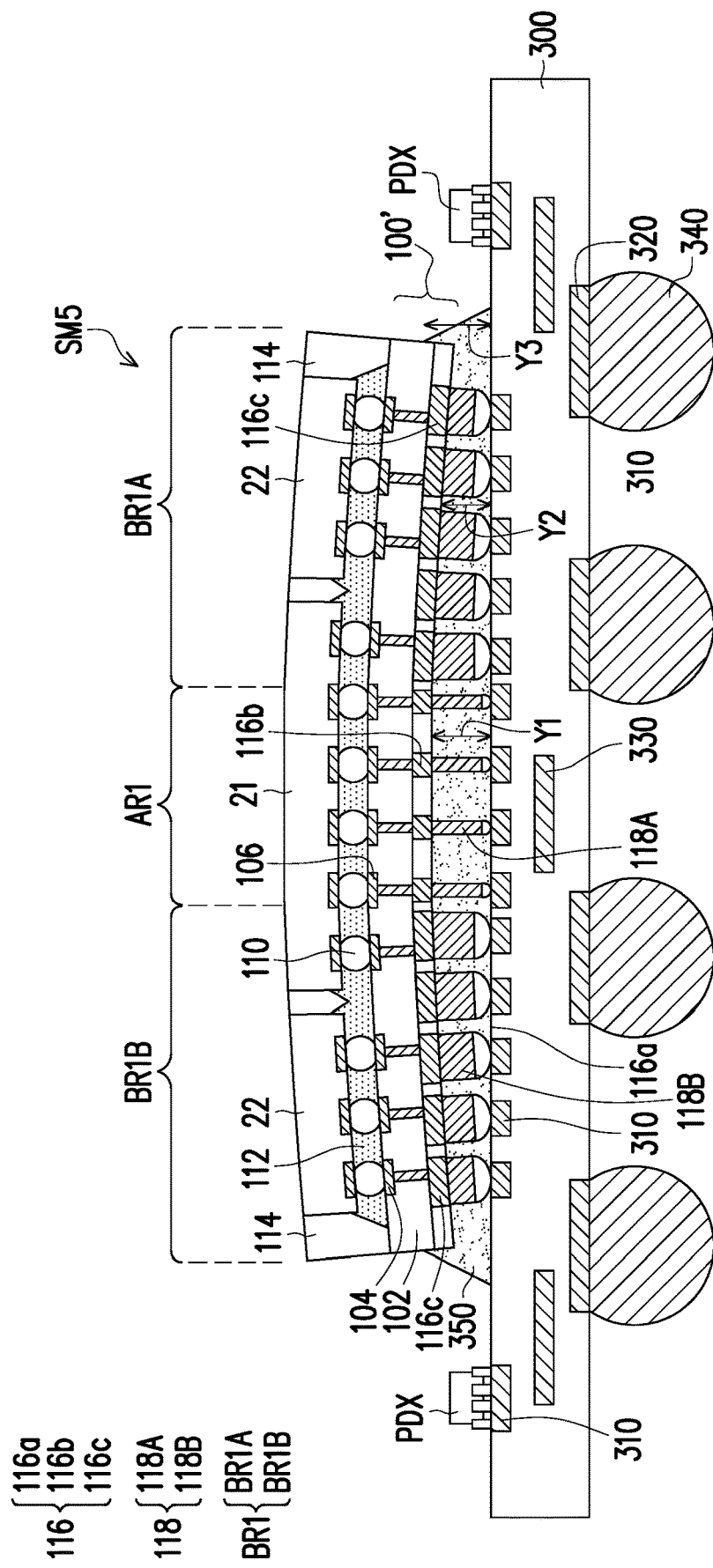
Figure 7C:
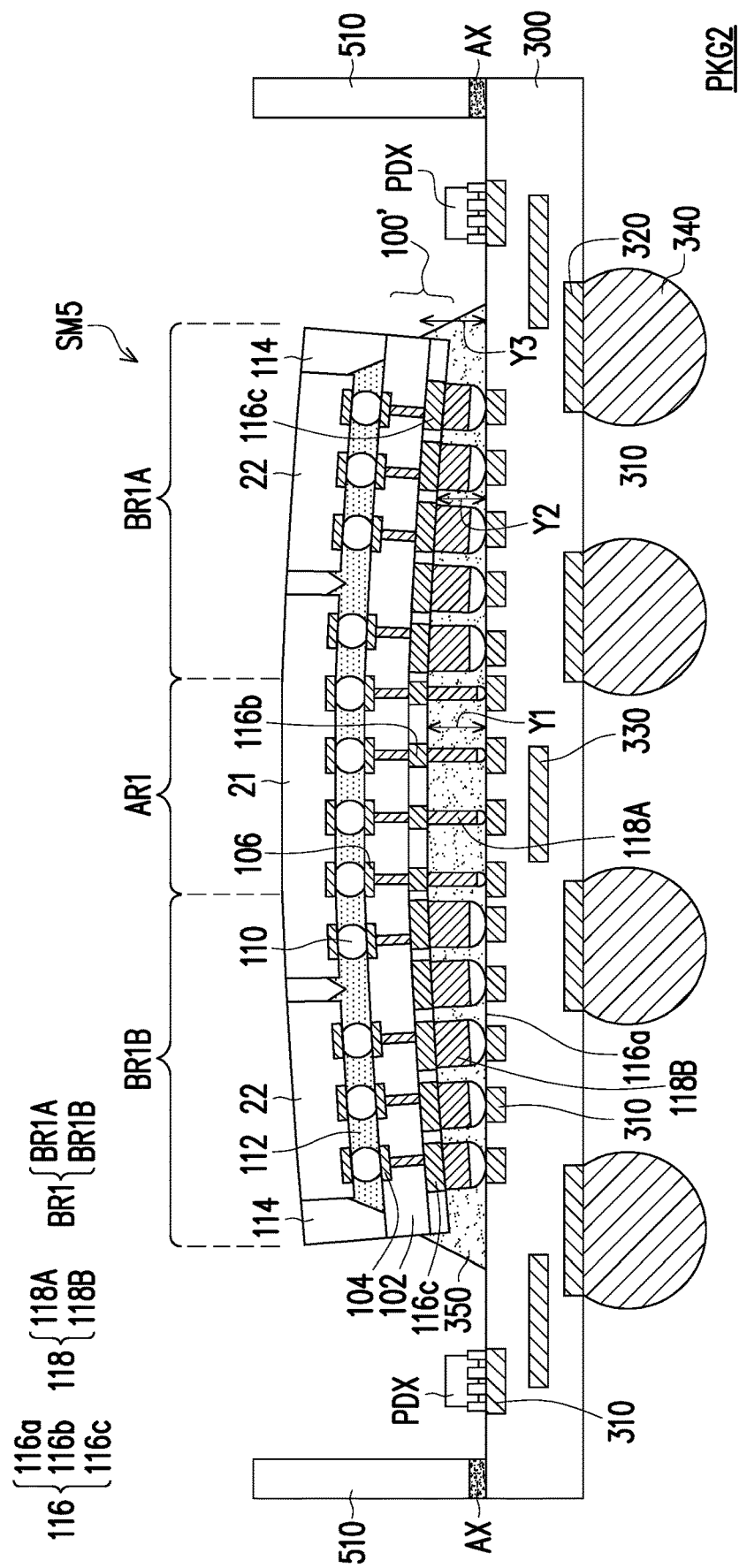

FIG. 7A to FIG. 7C are schematic sectional views of various stages in a method of fabricating a package structure according to some other exemplary embodiments of the present disclosure. The package structure PKG2 shown in FIG. 7A to FIG. 7C is similar to the package structure PKG1 shown in FIG. 3A to FIG. 3C. Therefore, the same reference numerals are used to refer to the same or liked parts, and its detailed descriptions are omitted herein.

Referring to FIG. 7A, in some embodiments, the semiconductor package SM5 shown in FIG. 6A is mounted or attached onto a circuit substrate 300 through the bump structures 118 (first and second bump structures 118A, 118B). In the exemplary embodiment, the semiconductor package SM (or the interposer structure 100') has a cry warpage. For example, in a case of having the cry warpage, the center region AR1 of the semiconductor package SM is bent inwards away from the circuit substrate 300, while the side regions BR1 are protruding towards the circuit substrate 300. Furthermore, a height difference WP2 at the top surface 116s of the redistribution structure 116 between the center region AR1 and the side regions BR1 of the semiconductor package SM5 defines the level of its warpage.

In some embodiments, when the height difference WP1 or warpage of the semiconductor package SM5 is equal to or greater than 45 μm, then the maximum width W1 of the first bump structures 118A and the maximum width W2 of the second bump structures 118B fulfills the following relationship: W2>W1≥0.90*W2. Furthermore, when the height difference WP1 or warpage of the semiconductor package SM5 is less than 45 μm, and the maximum width W1 of the first bump structures 118A and the maximum width W2 of the second bump structures 118B fulfills the following relationship: 0.90*W2>W1≥0.8*W2. By designing the heights and widths of the first bump structures 118A and the second bump structures 118B to fulfill the above relationship, the warpage problem of the semiconductor package SM5 may be appropriately resolved.

Referring to FIG. 7B, in a subsequent step, an underfill structure 350 is formed to fill up the spaces in between the circuit substrate 300 and the semiconductor package SM5. In certain embodiments, the underfill structure 350 fills up the spaces in between adjacent bump structures 118 and covers the bump structures 118. For example, the underfill structure 350 surrounds the bump structures 118. In some embodiments, the underfill structure 350 covering the center region AR1 of the interposer structure 100' has a first average height Y1, while the underfill structure 350 covering the side regions BR1 (BR1A, BR1B) has a second average height Y2. Furthermore, the underfill structure 350 covering the sidewalls of the semiconductor package SM has a maximum height Y3. In the exemplary embodiment, the first average height Y1 is greater than the second average height Y2, and the maximum height Y3 is greater than both the first average height Y1 and the second average height Y2. In some embodiments, the passive devices PDX is exposed by the underfill structure 350, and kept a distance apart from the underfill structure 350. In other words, the underfill structure 350 does not cover the passive devices PDX.

Referring to FIG. 7C, in a subsequent step, a ring structure 510 is attached to the circuit substrate 300 through an adhesive Ax. After attaching the ring structure 510 onto the circuit substrate 300, a package structure PKG2 according to some embodiments of the present disclosure may be accomplished. In the package structure PKG2 illustrated in FIG. 7C, the semiconductor package SM5 has a cry warpage. Since the bump structures 118 (118A, 118B) are arranged to have decreasing heights and increasing widths from the center region AR1 to the side regions BR1 (BR1A, BR1B), the warpage problem may be compensated and the cold joint problem may be prevented. Overall, a reliability of the package structure PKG2 may be improved.

Figure 8:
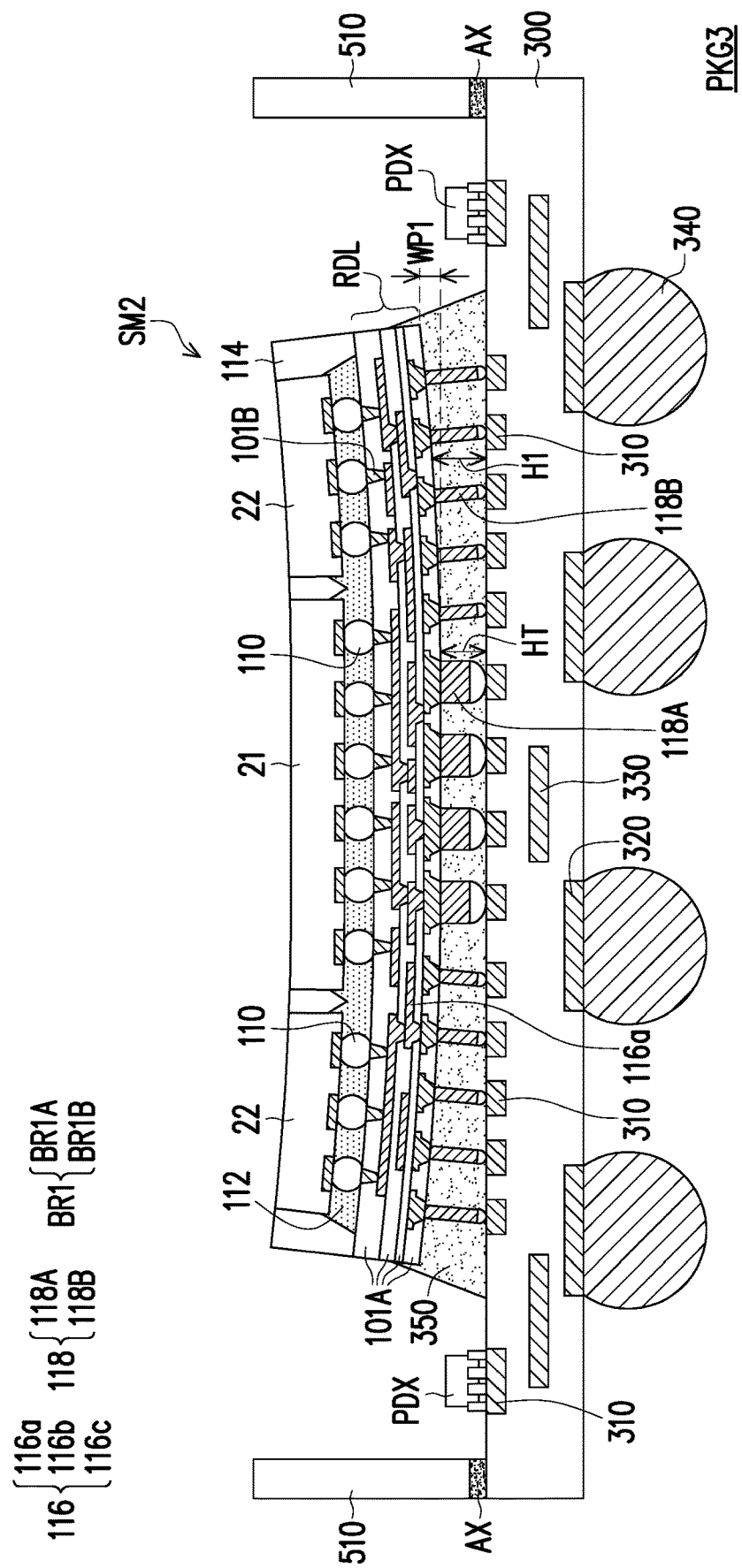
FIG. 8 is a schematic sectional view of a package structure according to some other exemplary embodiments of the present disclosure.

FIG. 8 is a schematic sectional view of a package structure according to some other exemplary embodiments of the present disclosure. The package structure PKG3 illustrated in FIG. 8 is similar to the package structure PKG illustrated in FIG. 3C. Therefore, the same reference numerals are used to refer to the same or liked parts, and its detailed description will be omitted herein. The difference between the embodiments is that the semiconductor package SM2 in FIG. 2 is used in replacement of the semiconductor package SM in FIG. 1L. The details of the semiconductor package SM2 may be referred to the descriptions of FIG. 2, thus will not be repeated herein.

As illustrated in FIG. 8, in some embodiments, the semiconductor package SM2 obtained in FIG. 1L is mounted or attached onto a circuit substrate 300 through the bump structures 118 (first and second bump structures 118A, 118B). Subsequently, the underfill structure 350 is formed to fill up the spaces in between the circuit substrate 300 and the semiconductor package SM2, and the ring structure 510 is attached to the circuit substrate 300 through the adhesive Ax. In a similar way, in case the semiconductor package SM2 has a smile warpage, since the bump structures 118 (118A, 118B) are arranged to have increasing heights and decreasing widths from the center region AR1 to the side regions BR1 (BR1A, BR1B), the warpage problem may be compensated and the cold joint problem may be prevented. Overall, a reliability of the package structure PKG3 may be improved.

In the above-mentioned embodiments, the semiconductor package of the package structure is designed to include at least the first bump structures and the second bump structures having different heights and different shapes. For example, when the semiconductor package has a smile warpage, the bump structures are arranged to have decreasing heights and increasing widths from the center region to the side region. On the other hand, when the semiconductor package has a cry warpage, the bump structures are arranged to have increasing heights and decreasing widths from the center region to the side region. As such, the warpage problem (either cry or smile warpage) may be compensated and the cold joint problem may be prevented. Overall, a reliability of the package structure may be improved.

In accordance with some embodiments of the present disclosure, a package structure includes a circuit substrate, a semiconductor package, first bump structures and second bump structures. The semiconductor package is disposed on the circuit substrate, wherein the semiconductor package includes a center region and side regions surrounding the center region. The first bump structures are disposed on the center region of the semiconductor package and electrically connecting the semiconductor package to the circuit substrate. The second bump structures are disposed on the side regions of the semiconductor package and electrically connecting the semiconductor package to the circuit substrate, wherein the first bump structures and the second bump structures have different heights and different shapes.

In accordance with some other embodiments of the present disclosure, a package structure includes a circuit substrate, an interposer structure, a plurality of bump structures, a plurality of semiconductor dies and an insulating encapsulant. The interposer structure is disposed on and electrically connected to the circuit substrate. The plurality of bump structures is disposed in between the circuit substrate and the interposer structure, and electrically connecting the interposer structure to the circuit substrate, wherein the plurality of bump structures disposed on a first region of the interposer structure are spaced apart from one another by a first spacing, and the plurality of bump structures disposed on a second region of the interposer structure are spaced apart from one another by a second spacing, wherein the second spacing is different than the first spacing, and wherein the plurality of bump structures disposed on the first region and the second region have different sizes. The semiconductor dies are disposed on a backside surface of the interposer structure and electrically connected to the interposer structure. The insulating encapsulant is disposed on the backside surface of the interposer structure and surrounding the plurality of semiconductor dies.

In accordance with yet another embodiment of the present disclosure, a package structure includes a circuit substrate, an interconnect structure, first bump structures, second bump structures, and an underfill structure. The interconnect structure is disposed on and electrically connected to the circuit substrate. The first bump structures are disposed between the circuit substrate and the interconnect structure. The second bump structures are disposed between the circuit substrate and the interconnect structure, wherein the second bump structures have a greater height than first bump structures, and the arrangement of the first bump structures on the interconnect structure are more dense than the arrangement of the second bump structures on the interconnect structure. The underfill structure is covering the first bump structures and the second bump structures.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a circuit substrate;
   a semiconductor package disposed on the circuit substrate, wherein the semiconductor package comprises a center region and side regions surrounding the center region;
   first bump structures disposed on the center region of the semiconductor package and electrically connecting the semiconductor package to the circuit substrate; and
   second bump structures disposed on the side regions of the semiconductor package and electrically connecting the semiconductor package to the circuit substrate, wherein the first bump structures and the second bump structures have different heights and different shapes, wherein a warpage of the semiconductor package is less than 45 μm, and the maximum width W1 of the first bump structures and the maximum width W2 of the second bump structures fulfills the following relationship: $0.90*W1 > W2 \geq 0.8*W1$.

2. The package structure according to claim 1, wherein the first bump structures have an oval shape while the second bump structures have a circular shape, and a maximum width W1 of the first bump structures is greater than a maximum width W2 of the second bump structures.

3. The package structure according to claim 2, wherein a height of the first bump structures is smaller than a height of the second bump structures.

4. The package structure according to claim 1, wherein the side regions comprise:
   a first side region comprising a first sub-region, a second sub-region and a third sub-region, the first sub-region is joined with the center region, the third sub-region is located at a first peripheral side of the semiconductor package, and the second sub-region is located in between the first sub-region and the third sub-region;
   a second side region comprising a fourth sub-region, a fifth sub-region and a sixth sub-region, the fourth sub-region is joined with the center region, the sixth sub-region is located at a second peripheral side of the semiconductor package opposite to the first peripheral side, and the fifth sub-region is located in between the fourth sub-region and the sixth sub-region; and
   wherein the second bump structures comprise:
      first portion bumps located in the first sub-region and the fourth sub-region and having a height of H1;
      second portion bumps located in the second sub-region and the fifth sub-region and having a height of H2; and
      third portion bumps located in the third sub-region and the sixth sub-region and having a height of H3, wherein H1<H2<H3.

5. The package structure according to claim 1, wherein the side regions comprise:
   a first side region joined with the center region and encircling the center region;
   a second side region joined with the first side region and encircling the first side region; and
   a third side region encircling the second side region and located at peripheral sides of the semiconductor package; and
   wherein the second bump structures comprise:
      first portion bumps located in the first side region and having a height of H1;
      second portion bumps located in the second side region and having a height of H2; and
      third portion bumps located in the third side region and having a height of H3, wherein H1<H2<H3.

6. The package structure according to claim 1, wherein the first bump structures have a circular shape while the second bump structures have an oval shape, and a maximum width of the first bump structures is smaller than a maximum width of the second bump structures.

7. The package structure according to claim 1, wherein the first bump structures and the second bump structures respectively include metal pillars and solders disposed on the metal pillars, and the heights of the first bump structures and the second bump structures are defined as a total height of the metal pillars and the solders.

8. A package structure, comprising:
   a circuit substrate including a plurality of contact pads;
   an interposer structure disposed on and electrically connected to the circuit substrate, and including a plurality of metallization patterns;
   a plurality of bump structures sandwiched in between the circuit substrate and the interposer structure, and physically and electrically connecting the plurality of metallization patterns of the interposer structure to the plurality of contact pads of the circuit substrate, wherein the plurality of bump structures disposed on the plurality of metallization patterns in a first region of the interposer structure are spaced apart from one another by a first spacing, and the plurality of bump structures disposed on the plurality of metallization patterns in a second region of the interposer structure are spaced apart from one another by a second spacing, wherein the second spacing is different than the first spacing, and wherein the plurality of bump structures disposed on the first region and the second region have different sizes;
   a plurality of semiconductor dies disposed on a backside surface of the interposer structure and electrically connected to the interposer structure; and
   an insulating encapsulant disposed on the backside surface of the interposer structure and surrounding the plurality of semiconductor dies.

9. The package structure according to claim 8, wherein the interposer structure has a smile warpage, and the plurality of bump structures disposed on the first region has a smaller height than the plurality of bump structures disposed on the second region, and the first spacing is smaller than the second spacing.

10. The package structure according to claim 9, wherein a maximum width W1 of the plurality of bump structures disposed on the first region is greater than a maximum width W2 of the plurality of bump structures disposed on the second region.

11. The package structure according to claim 9, wherein the plurality of bump structures disposed on the first region has an oval shape, and the plurality of bump structures disposed on the second region has a circular shape.

12. The package structure according to claim 8, wherein the interposer structure has a cry warpage, and the plurality of bump structures disposed on the first region has a greater height than the plurality of bump structures disposed on the second region, and the first spacing is greater than the second spacing.

13. The package structure according to claim 12, wherein a maximum width W1 of the plurality of bump structures disposed on the first region is smaller than a maximum width W2 of the plurality of bump structures disposed on the second region.

14. The package structure according to claim 8, wherein the plurality of semiconductor dies and the insulating encapsulant are physically separated from the circuit substrate.

15. A package structure, comprising:
a circuit substrate having a top surface;
an interconnect structure having a top surface and disposed on and electrically connected to the circuit substrate, wherein the top surface of the circuit substrate is facing the top surface of the interconnect structure;
first bump structures disposed between the circuit substrate and the interconnect structure;
second bump structures disposed between the circuit substrate and the interconnect structure, wherein the second bump structures have a greater height than first bump structures, and the arrangement of the first bump structures on the interconnect structure are more dense than the arrangement of the second bump structures on the interconnect structure; and
an underfill structure covering and directly contacting sidewalls of the first bump structures and sidewalls of the second bump structures, and covering and directly contacting the top surface of the circuit substrate and the top surface of the interconnect structure.

16. The package structure according to claim 15, wherein the first bump structures are disposed on a center region of the interconnect structure, and the second bump structures are disposed on side regions of the interconnect structure aside the center region.

17. The package structure according to claim 16, wherein the underfill structure covering the center region has a first average height Y1, and the underfill structure covering the side regions has a second average height Y2, wherein the second average height Y2 is greater than the first average height Y1.

18. The package structure according to claim 16, wherein the first bump structures have an oval shape, and the second bump structures have a circular shape.

19. The package structure according to claim 15, wherein a warpage of the interconnect structure is less than 45 μm, and a maximum width W1 of the first bump structures and a maximum width W2 of the second bump structures fulfills the following relationship: $0.95*W1>W2\geq0.9*W1$.

20. The package structure according to claim 15, further comprising a plurality of passive devices disposed on and directly contacting the top surface of the circuit substrate, wherein the plurality of passive devices is spaced apart from the interconnect structure, the first bump structures and the second bump structures.

* * * * *